United States Patent
Yoon et al.

(10) Patent No.: US 11,894,659 B2
(45) Date of Patent: Feb. 6, 2024

(54) SURFACE EMITTING LASER DEVICE AND A LIGHT EMITTING DEVICE INCLUDING THE SAME

(71) Applicant: SUZHOU LEKIN SEMICONDUCTOR CO., LTD., Taicang (CN)

(72) Inventors: Su Jung Yoon, Seoul (KR); Jeong Sik Lee, Seoul (KR); Yong Gyeong Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 259 days.

(21) Appl. No.: 17/271,821

(22) PCT Filed: Aug. 27, 2019

(86) PCT No.: PCT/KR2019/010878
§ 371 (c)(1),
(2) Date: Feb. 26, 2021

(87) PCT Pub. No.: WO2020/045934
PCT Pub. Date: Mar. 5, 2020

(65) Prior Publication Data
US 2021/0344171 A1 Nov. 4, 2021

(30) Foreign Application Priority Data
Aug. 29, 2018 (KR) .......................... 10-2018-0101719

(51) Int. Cl.
*H01S 5/183* (2006.01)
*H01S 5/42* (2006.01)

(52) U.S. Cl.
CPC ...... *H01S 5/18394* (2013.01); *H01S 5/18352* (2013.01); *H01S 5/423* (2013.01)

(58) Field of Classification Search
CPC ................ H01S 5/423; H01S 5/18352; H01S 5/18308–18338
See application file for complete search history.

(56) References Cited

U.S. PATENT DOCUMENTS 5,482,891 A 1/1996 Shieh et al.
6,658,040 B1 12/2003 Hu et al.
(Continued)

FOREIGN PATENT DOCUMENTS

JP 2005-217147 A 8/2005
JP 2009-65086 A 3/2009
(Continued)

OTHER PUBLICATIONS

Machine English translation of JP-2017071296-A (Year: 2017).*
International Search Report (PCT/ISA/210) issued in PCT/KR2019/010878, dated Dec. 11, 2019.

*Primary Examiner* — Minsun O Harvey
*Assistant Examiner* — Stephen Sutton Kotter
(74) *Attorney, Agent, or Firm* — Birch, Stewart, Kolasch & Birch, LLP

(57) ABSTRACT

An embodiment relates to a surface emitting laser device and a light emitting device including the same. The surface emitting laser device according to the embodiment includes: a first emitter having a first aperture and a first insulating region; a second emitter having a second aperture and a second insulating region and disposed adjacent to the first emitter; a third emitter having a third aperture and a third insulating region and disposed adjacent to the first emitter and the second emitter; and a first trench region disposed between the first emitter and the third emitter. The first trench region is disposed inside a virtual triangle connecting a center of the first aperture of the first emitter, a center of (Continued)

the second aperture of the second emitter, and a center of the third aperture of the third emitter.

14 Claims, 20 Drawing Sheets

(56) References Cited

U.S. PATENT DOCUMENTS

| | | |
|---|---|---|
| 7,116,854 B2 | 10/2006 | Kaneko et al. |
| 10,574,031 B2 | 2/2020 | Barve et al. |
| 2005/0158902 A1* | 7/2005 | Chua ................ B82Y 20/00 |
| | | 438/32 |
| 2010/0284432 A1 | 11/2010 | Hoshino et al. |
| 2011/0194579 A1 | 8/2011 | Maeda et al. |
| 2017/0353012 A1 | 12/2017 | Barve et al. |

FOREIGN PATENT DOCUMENTS

| | | | |
|---|---|---|---|
| JP | 2017-17296 A | | 1/2017 |
| JP | 2017017296 A | * | 1/2017 |
| KR | 10-0833442 B1 | | 5/2008 |
| KR | 10-2017-0099368 A | | 8/2017 |

* cited by examiner

FIG. 2A        Prior Art
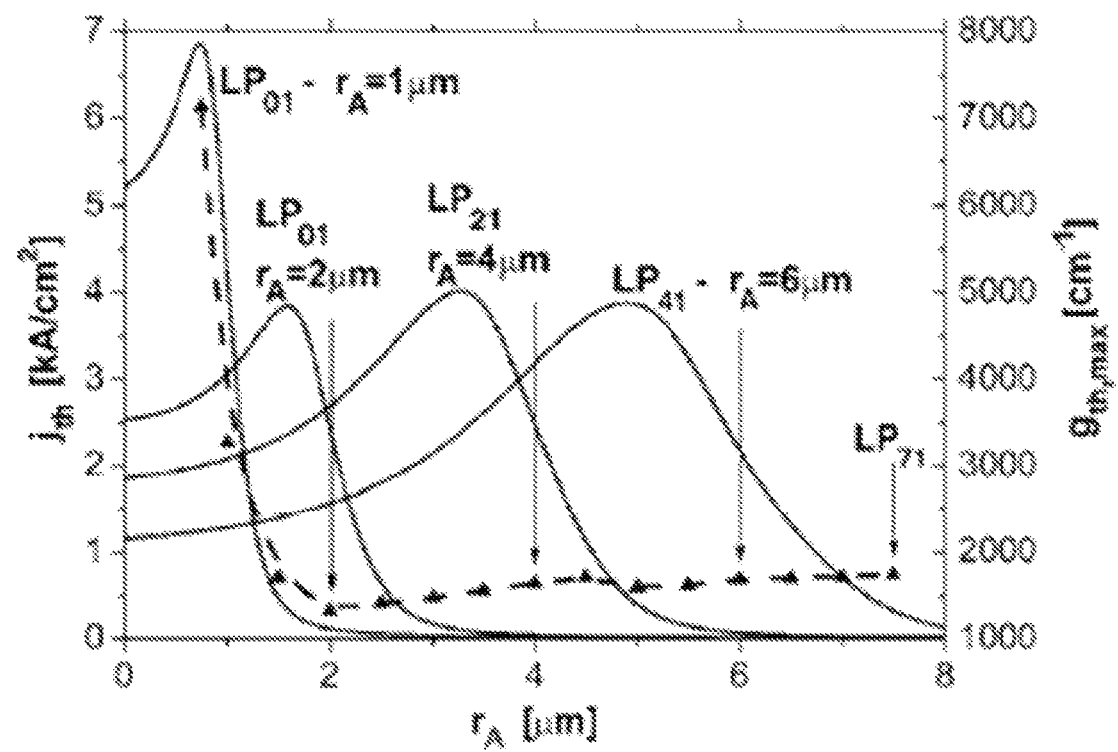

$r_A = 4.5 \, \mu m$ (b1)

(b2)

(b3)

(d1)

(d2)

(d3)

(d4)

FIG. 4A        Prior Art
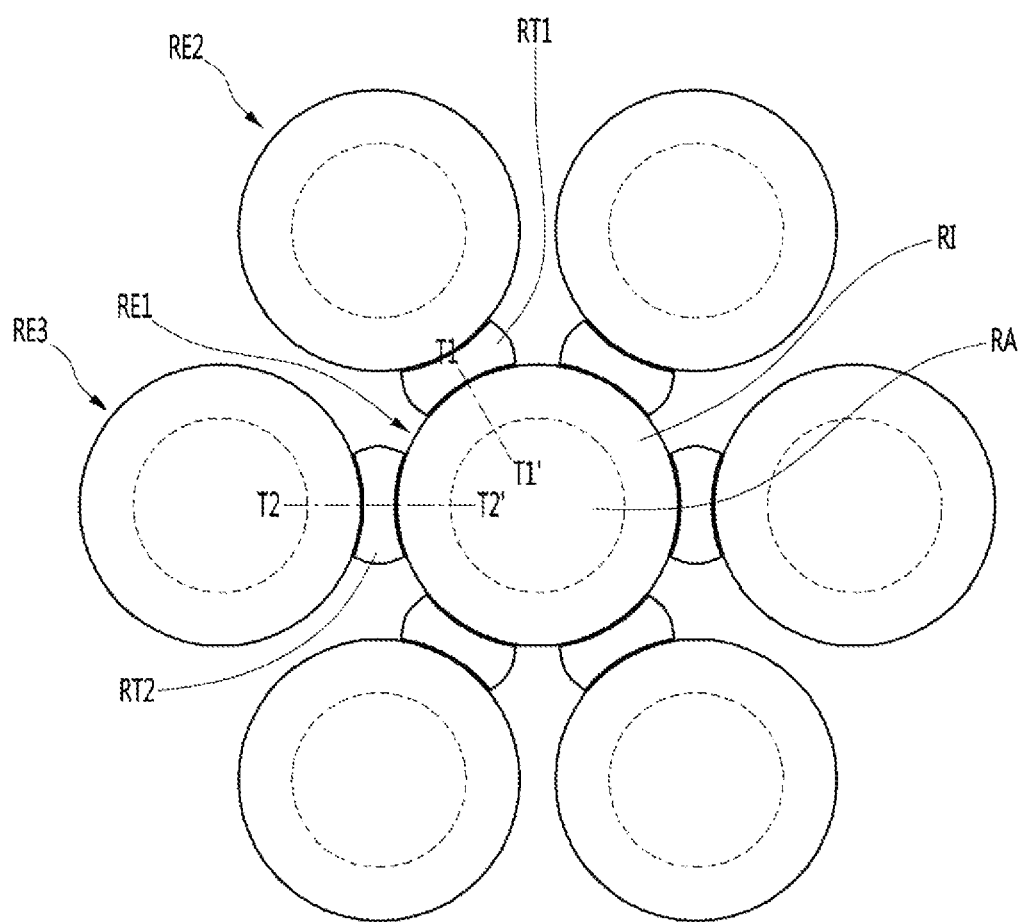

SURFACE EMITTING LASER DEVICE AND A LIGHT EMITTING DEVICE INCLUDING THE SAME

CROSS REFERENCE TO RELATED APPLICATIONS

This application is the National Phase of PCT International Application No. PCT/KR2019/010878, filed on Aug. 27, 2019, which claims priority under 35 U.S.C. 119(a) to Patent Application No. 10-2018-0101719, filed in the Republic of Korea on Aug. 29, 2018, all of which are hereby expressly incorporated by reference into the present application.

TECHNICAL FIELD

The embodiment relates to a semiconductor device, and more particularly, to a surface emitting laser device and a light emitting device including the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light-emitting diode backlight is replacing a cold cathode fluorescent lamp (CCFL) constituting a transmission module of an optical communication means and a backlight of a liquid crystal display (LCD) display device. Applications are expanding to white light-emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface emitting laser (VCSEL), which is used for optical communication, optical parallel processing, and optical connection. On the other hand, in the case of a laser diode used in such a communication module, it is designed to operate at a low current.

Meanwhile, response speed was important in the existing structure for data optical communication, but as it is recently applied to a high power PKG for a sensor, optical output and voltage efficiency become important characteristics.

For example, a 3D sensing camera is a camera capable of capturing depth information of an object, and has recently been in the spotlight in conjunction with augmented reality. On the other hand, for sensing the depth of the camera module, a separate sensor is mounted, and it is divided into two types: Structured Light (SL) method and Time of Flight (ToF) method.

In the structured light (SL) method, a laser of a specific pattern is radiated onto a subject, and the depth is calculated by analyzing the degree of deformation of the pattern according to the shape of the subject surface, and then combining it with a picture taken by an image sensor to obtain a 3D photographing result.

In contrast, the ToF method is a method in which a 3D photographing result is obtained by calculating the depth by measuring the time the laser is reflected off the subject and returning, and then combining it with the picture taken by the image sensor.

Accordingly, the SL method has an advantage in mass production in that the laser must be positioned very accurately, while the ToF technology relies on an improved image sensor, and it is possible to adopt either method or both methods in one mobile phone.

For example, a 3D camera called True Depth can be implemented in the front of a mobile phone in the SL method, and the ToF method can be applied in the rear side.

Meanwhile, when a VCSEL is applied to a structured light sensor, a time of flight (ToF) sensor, or a laser diode autofocus (LDAF), it operates at a high current. Accordingly, problems such as a decrease in luminous intensity output or an increase in threshold current occur.

As described above, in the VCSEL package technology, the ToF method uses the VCSEL chip as a light source, and calculates the time difference of the reflected pulse beam by flash type pulse projection through a diffuser to extract the depth.

For example, FIG. 1 is an exemplary diagram of a method of determining a field of interest (FOI) and a field of view (FOV) by a combination of a beam divergence and a diffuser beam angle in a VCSEL chip. Accordingly, it is important to control the beam divergence in the VCSEL chip to determine the FOI and FOV.

Next, FIG. 2A shows mode change data according to an aperture size in the related art.

In the related art, the aperture size is increasing in accordance with the demand for a high-output VCSEL package.

In VCSEL technology, a small size aperture, for example, 3 μm or less in diameter ($r_A$) is desirable for single fundamental mode stabilization, but a large size aperture in a high-power VCSEL package is required.

On the other hand, as shown in FIG. 2A, when the aperture size, for example, the diameter $r_A$ of the aperture increases, a problem occurs in that the light emission mode changes or the divergence angle changes due to mode hopping.

Specifically, referring to FIG. 2A, when the aperture diameter $r_A$ increases, the divergence mode changes, so that a higher mode shift occurs.

For example, as the aperture size increases in the related art, LP 01 ($r_A$=2 μm), LP 21 ($r_A$=4 μm), LP 41 ($r_A$=6 μm) changes to higher order mode such that higher mode shift phenomenon occurs.

However, such a phenomenon of changing to a higher-order mode causes a problem of splitting a beam pattern or increasing a divergence angle of beams.

For example, FIG. 2B shows beam profile data in the far field of a conventional VCSEL, and the beam pattern of the outgoing beam is fragmented as the applied current increases. For example, FIG. 2B is a VCSEL having an aperture with a diameter ($r_A$) of 4.5 μm in a circular shape under the condition that the threshold current ($I_{th}$) is 1.2 mA, and as the applied current increases from 1.2 mA (b1) to 3.0 mA (b2) and 5.0 mA (b3), respectively, the oscillation mode changes to a higher-order mode, showing a problem that the beam pattern of the outgoing beam is split.

Meanwhile, FIG. 2C shows beam profile data in a far field of a conventional VCSEL, and when the aperture diameter $r_A$ is 6.0 μm, it is oscillated in a higher-order mode immediately after lasing. In addition, as the current increases, multi-mode oscillation has become more intense.

On the other hand, in this application, for the measurement of the far field beam profile of the surface emitting laser device, 8050M-GE-TE (Thorlabs, Inc.), which is a beam profiler measuring instrument, was used. The specification information of 8050M-GE-TE is 8 Megapixel Monochrome Scientific CCD Camera, Hermetically Sealed Cooled Package, GigE Interface. However, the measuring equipment of the far field beam profile is not limited thereto.

Next, FIG. 3 shows near field image data as an increase in applied current in a conventional VCSEL, and also shows data of divergence angle of beams according to each applied current. Referring to FIG. 3, as the applied current increased from 3 mA (d1) to 5 mA (d2), 7.5 mA (d3), and 12 mA (d4), the divergence angle of beams rapidly increased to 21.0°, 25.0°, 27° and 31.0°, respectively.

That is, according to the related art, as a high current is applied, current crowding occurs at the aperture edge, and damage to the aperture which is a laser emission area may occur. In addition, while the dominant mode is oscillated at a low current, but the divergence angle of beams is increased due to the oscillation of the higher mode as a high current is applied.

In particular, according to the related art, there is a problem in that the wavelength and the divergence angle change due to divergence mode hopping. For stabilization of the divergence mode, the diameter of the aperture is preferably less than about 5.0 μm. However, a large aperture is required for high output, and a technical contradiction arises in that divergence angle of beams increases due to instability of the oscillation mode in an aperture of a larger size of 5.0 μm or more.

Next, FIG. 4A is a plan view of a conventional VCSEL emitter, FIG. 4B is a cross-sectional photograph taken along line T1-T1' of FIG. 4A, and FIG. 4C is a cross-sectional photograph taken along line T2-T2' of FIG. 4A.

Specifically, referring to FIG. 4A, the VCSEL of the related art may include a plurality of emitters, for example, a first emitter RE1, a second emitter RE2, a third emitter RE3, and the like. In each emitter, an aperture RA and an insulating region RI are provided. A mesa process is performed to form the aperture RA and the insulating region RI, which may be performed through a predetermined trench process.

For example, a first trench RT1 may be disposed between the first emitter RE1 and the second emitter RE2, and a second trench RT2 may be disposed between the first emitter RE1 and the third emitter RE3.

FIG. 4B is a cross-sectional photograph taken along line T1-T1' of FIG. 4A. In the related art, when applying a trench, the spacing between emitters must be narrowed in order to increase the oscillation area. To do this, the trench etching angle (EA1) should be made an almost right angle. Accordingly, in the related art, the etching angle (EA1) of the trench reaches about 80°.

However, as the etching angle EA1 increases as shown in FIG. 4B, there is a problem in that a crack occurs due to the occurrence of the first void V1 in the passivation process through the dielectric material formed thereafter.

In addition, referring to FIG. 4C, the electrode material is filled and disposed on the passivation at the trench location. As the first void V1 generated in the passivation is propagated or transmitted to the electrode material to generate the second void V2, there is a problem in that reliability deterioration occurs due to moisture penetration and generation of low current.

On the other hand, in the related art, in order to reduce the etching angle between emitters, a wide spacing between emitters must be secured. In this case, since the spacing between emitters cannot be narrowed, there is a technical contradiction in which a compact big VICEL device cannot be implemented.

Accordingly, in the related art level, as shown in FIG. 4B, the attempt for preventing the first void V1 from propagating is just forming a passivation layer in multiple layers.

SUMMARY

The embodiment is to provide a surface emitting laser device and a light emitting device including the same, having excellent reliability.

In addition, the embodiment is to provide a surface emitting laser device capable of preventing and a light emitting device including the same, for solving the problem of increasing the divergence angle of beams or splitting the beam pattern according to the higher mode shift despite the application of a high current or an increase in the aperture size.

The surface emitting laser device according to the embodiment may include a first emitter E1 including a first aperture 241, a first insulating region 242, a second emitter E2 including a second aperture 241b, a second insulating region 242b and disposed adjacent to the first emitter E1, a third emitter E3 including a third aperture 241c, a third insulating region 242c, disposed adjacent to the first emitter E1 and the second emitter E2 and a first trench region ET1 disposed between the first emitter E1 to third emitter E3.

The first trench region ET1 may be disposed inside a virtual triangle IT connecting a center of a first aperture 241 of the first emitter E1, a center of a second aperture 241b of the second emitter E2, and a center of the third aperture 241c of the third emitter E3.

In an embodiment, an inclination angle of the sidewall of the first emitter E1 formed by the first trench region may be 75° or less.

In the aperture region 240, an outer periphery of the insulating region 242 may be circular, and an outer periphery of the aperture 241 may have a polygonal shape.

In an embodiment, the first emitter E1 and the second emitter E2 are spaced apart by a first separation distance D1, and the first width W1 of the first trench region ET1 may be greater than the first separation distance D1.

For example, the first separation distance may have a minimum first distance to a maximum second distance range. And the first width W1 of the first trench region ET1 may be greater than the first distance, which is the minimum distance of the first separation distance D1.

In addition, the embodiment may include a fourth emitter including a fourth aperture and a fourth insulating region and disposed on the other side of the third emitter adjacent to the first emitter and the second emitter.

The embodiment may include a second trench region disposed between the first emitter, the second emitter, and the fourth emitter.

A second separation distance between the first trench region and the trench region may be greater than the first separation distance.

The first trench region ET1 may include a first round region ER1 and a first straight region EL1 and a second straight region EL2 disposed on both sides of the first round region ER1.

The first straight region EL1 may be greater than the first separation distance D1.

The first trench region ET1 may include a second round region ER2 extending from the first straight region EL1 and a third round region ER3 extending from the second straight region EL2, and a third straight region EL3 disposed between the second round region ER2 and the third round region ER3.

In an embodiment, the first round region ER1 may have a convex shape downward in the center direction of the first trench region ET1.

A central angle Θ of a sector having the first round region ER1 as an arc may be 25 to 45°.

The light emitting device of the embodiment may include the surface emitting laser device.

Advantageous Effects

The embodiment can provide a surface emitting laser device and a light emitting device including the same, having excellent reliability.

For example, in an embodiment, the first trench region ET1 can be positioned inside a virtual triangle IT connecting the center of the first aperture 241, the center of the second aperture 241b, and the center of the third aperture 241c. Accordingly, the inclination angle EA2 of the sidewall of the first emitter E1 formed by the trench region can be formed smoothly by expanding the region in which the trench region can be secured. Therefore, the reliability can be remarkably improved by preventing void generation in the passivation layer process formed later.

In addition, for example, in the embodiment, the first distance L1 of the first straight region EL1 in the first trench region ET1 may be controlled to be greater than the first separation distance D1 which is a distance between the first emitter E1 and the second emitter E2. Accordingly, an inclination angle EA2 of the sidewall of the first emitter E1 formed by the trench region may be smoothly formed by widening the region secured by the first trench region ET1. Therefore, the reliability can be remarkably improved by preventing void generation in the passivation layer process formed later.

In addition, it is possible to provide a surface emitting laser device and a light emitting device including the same, capable of solve the problem in that the divergence angle of beams increases or the beam pattern is split according to higher mode shift even when a high current is applied or despite an increase in the aperture size.

For example, in an embodiment, an optical confinement may be achieved at the edge of a polygon of the aperture 241 having excellent crystal quality. Accordingly, by controlling the available mode, there is a special technical effect in that the higher mode shift is delayed and the mode is maintained.

Also, for example, in the surface emitting laser device according to the embodiment, an aperture having a polygonal outer shape may be formed by controlling a shape of a trench region having excellent void-free quality in a circular mesa state. Accordingly, there is a technical effect of preventing a problem in which a divergence angle of beams or a beam pattern is split due to a higher mode shift, even when a high current is applied or despite an increase in the aperture size.

BRIEF DESCRIPTION OF THE DRAWINGS

FIG. 2A is a mode change data according to the aperture size in the related art.

FIG. 4A is a plan view of a related art VCSEL emitter.

DETAILED DESCRIPTION

Hereinafter, embodiments that can be implemented specifically for solving the above problems will be described with reference to the accompanying drawings.

In the description of the embodiment, when it is described as being formed "on or under" of each element, it means that the two elements are in direct contact with each other or one or more other elements can be indirectly disposed between two elements. In addition, when expressed as "on or under", the meaning of not only an upward direction but also a downward direction based on one element may be included.

First Embodiment

Figure 1:
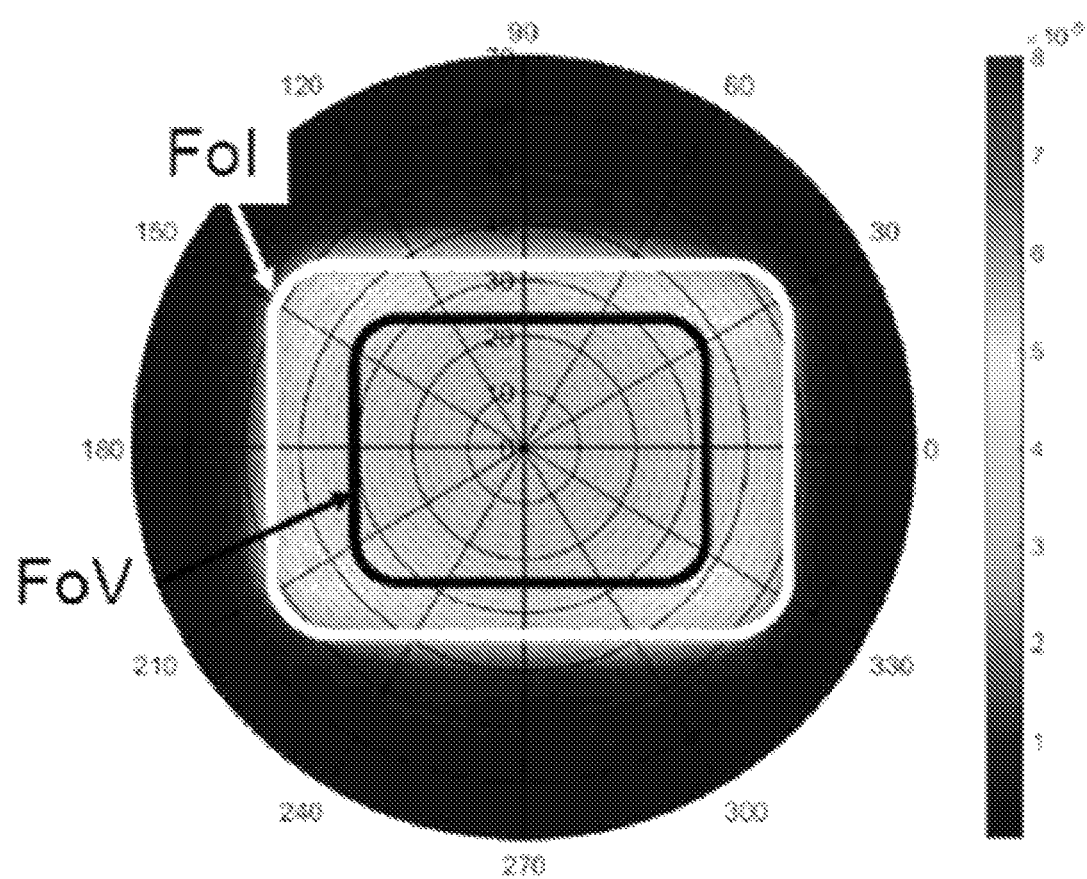
FIG. 1 is an exemplary diagram of a method of determining a field of interest (FOI) and a field of view (FOV) by a combination of a beam divergence and a diffuser beam angle in a VCSEL chip.
Figure 2B:
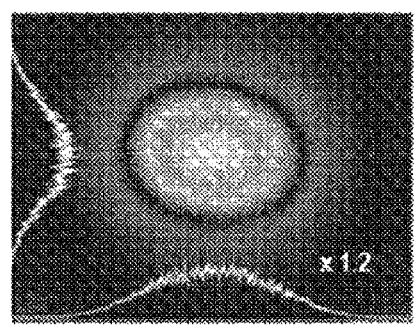
FIG. 2B is a beam profile data in a far field according to an increase in an applied current of a conventional VCSEL.
Figure 2B:
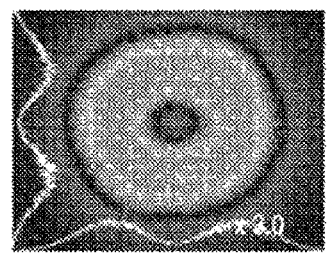
Figure 2B:
Figure 2C:
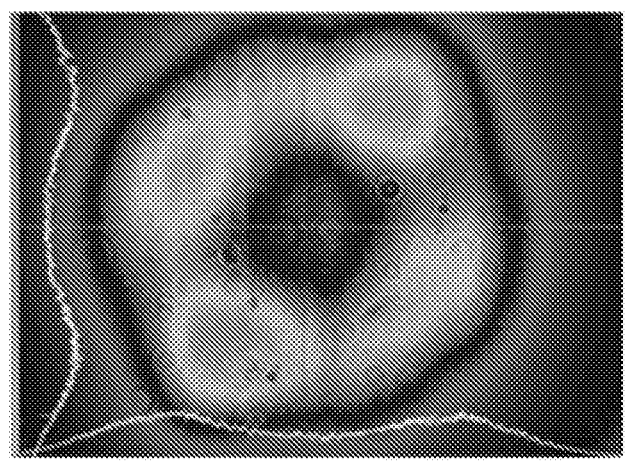
FIG. 2C is a beam profile data in a far field when the aperture diameter $r_A$ of a conventional VCSEL is about 6.0 μm.
Figure 3:
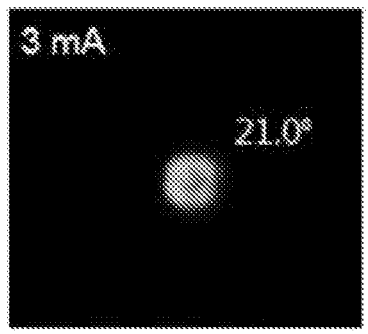
FIG. 3 is a near field image data according to an increase in applied current and data of a divergence angle of beams according to each applied current in a conventional VCSEL.
Figure 3:
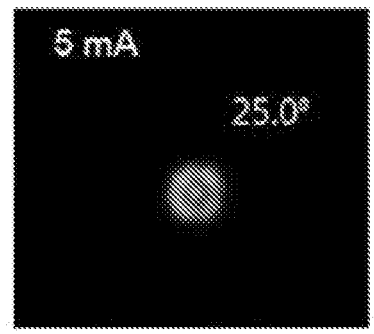
Figure 3:
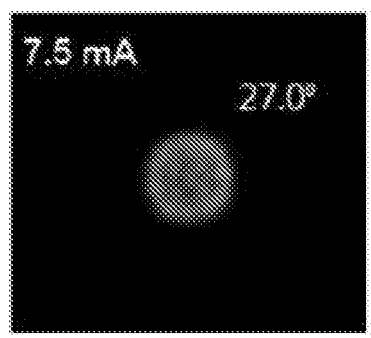
Figure 3:
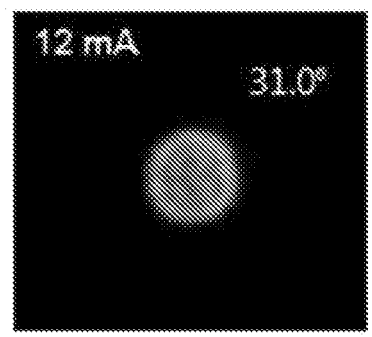
Figure 4B:
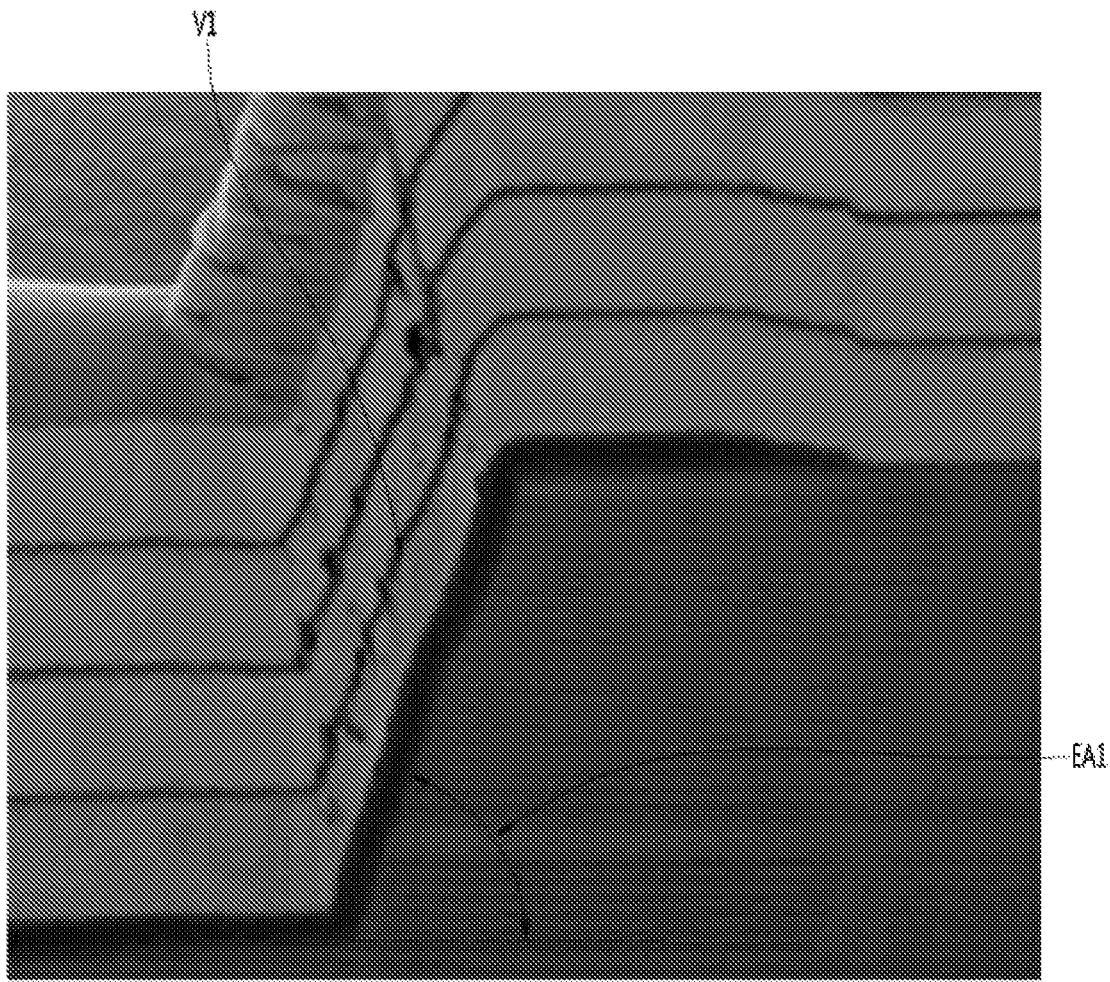
FIG. 4B is a cross-sectional photograph taken along line T1-T1' of FIG. 4A.
Figure 4C:
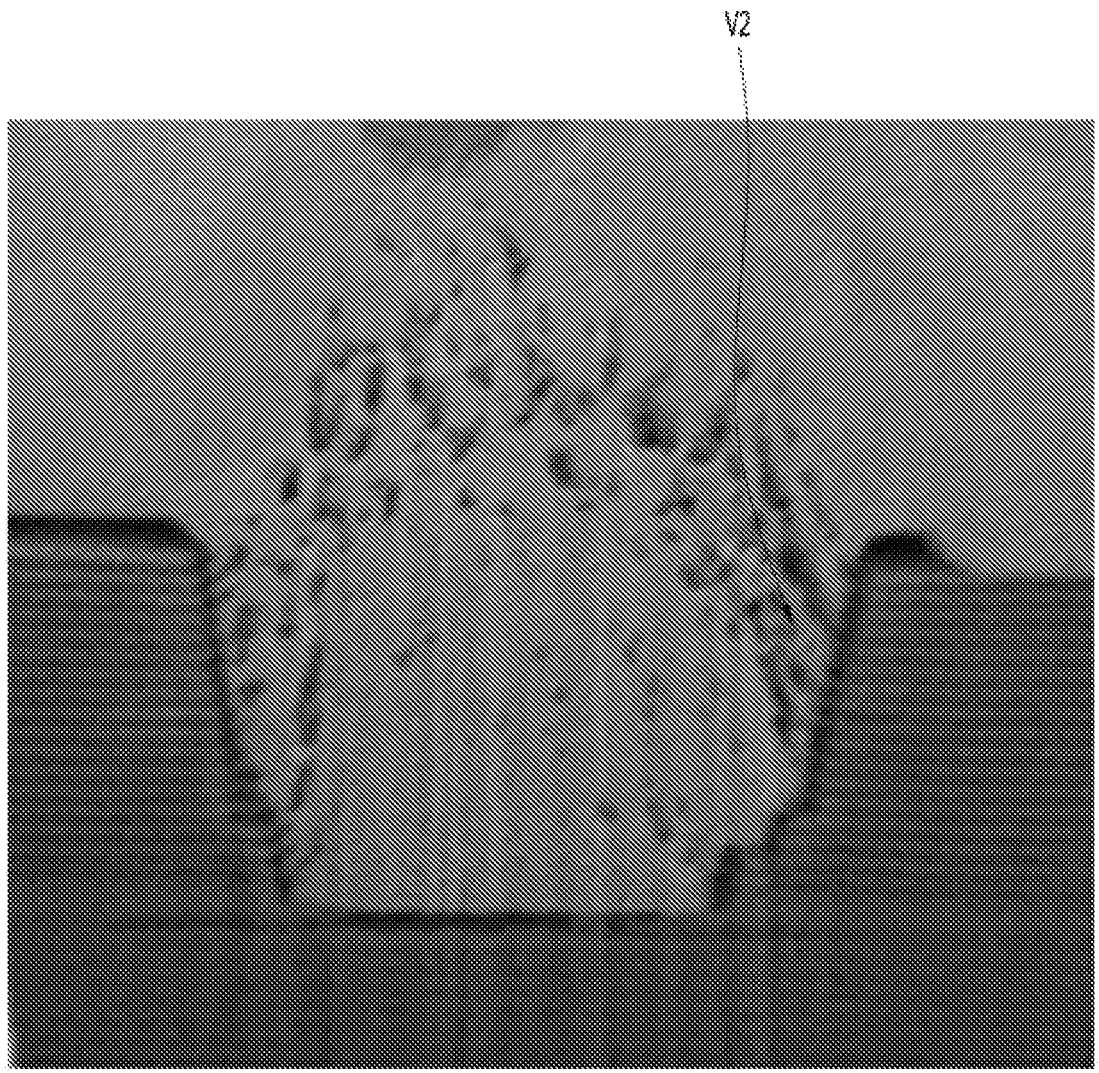
FIG. 4C is a cross-sectional photograph taken along the line T2-T2' of FIG. 4A.
Figure 5:
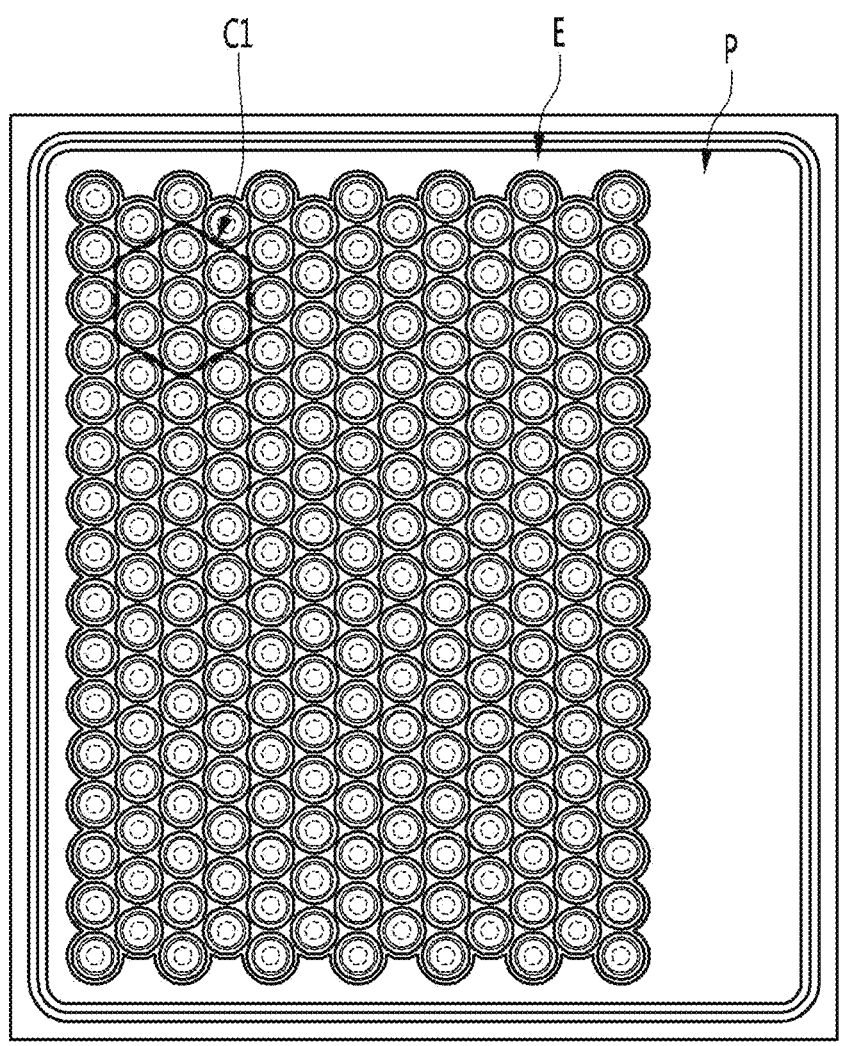
FIG. 5 is a plan view of a surface emitting laser device according to an embodiment.
Figure 6:
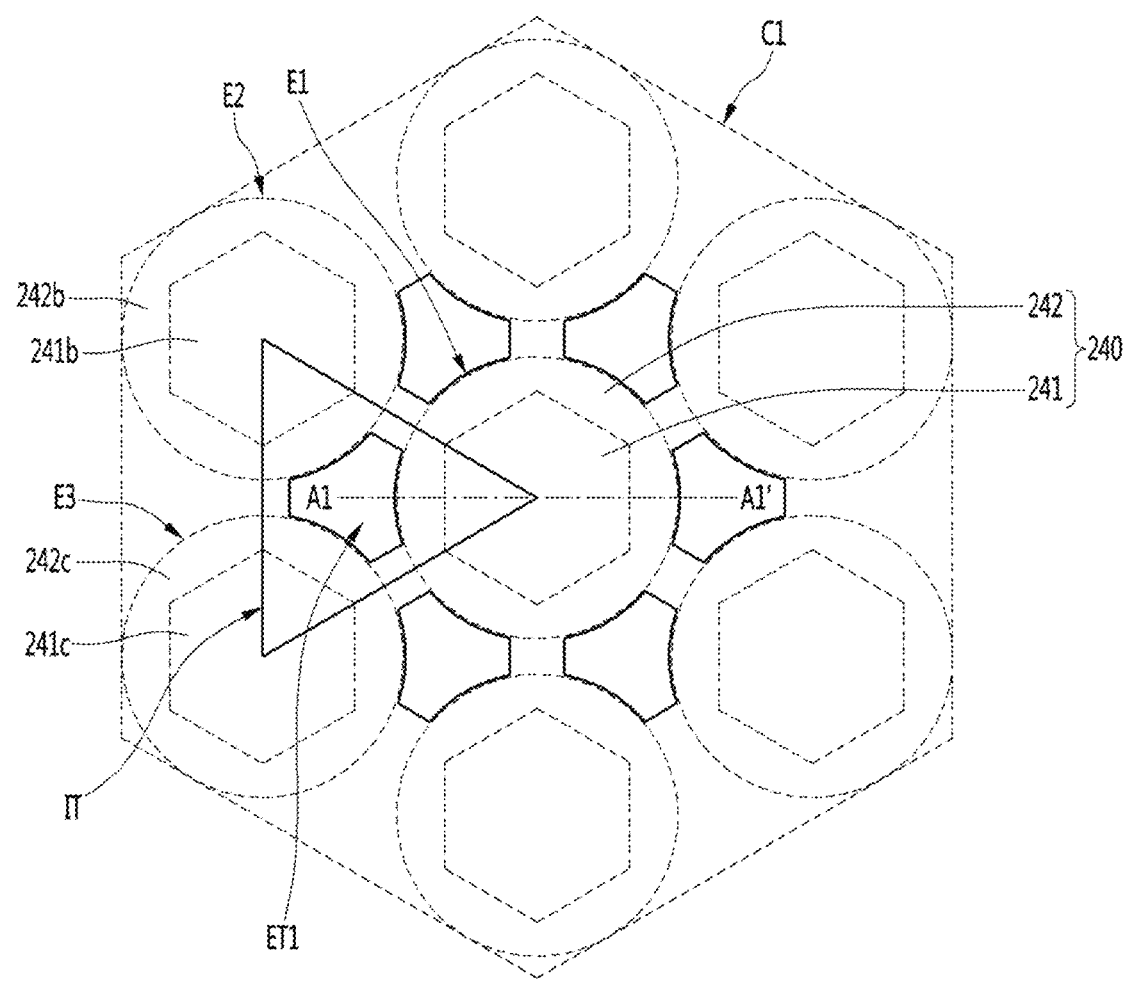
FIG. 6 is an enlarged view of a first area Cl of the surface emitting laser device according to the embodiment shown in FIG. 5.

FIG. 5 is a plan view of the surface emitting laser device 201 according to the embodiment, and FIG. 6 is an enlarged view of a first area C1 of the surface emitting laser device according to the embodiment shown in FIG. 5.

Referring to FIG. 5, the surface emitting laser device 201 according to the embodiment may include a light emitting part E and a pad part P, and the light emitting part E includes a plurality of light emitting emitters such as the emitters E1, E2, E3 arranged as shown in FIG. 6.

Referring to FIG. 6, the surface emitting laser device 201 of the embodiment may include a plurality of emitters adjacent to each other.

For example, the surface emitting laser device 201 of the embodiment includes a first emitter E1 including a first aperture 241, a first insulating region 242, a second emitter E2 including a second aperture 241b, a second insulating region 242b disposed adjacent to the first emitter E1, a third emitter E3 including a third aperture 241c, a third insulating region 242c disposed adjacent to the second emitter E2 and a first trench region ET1 to be disposed between the first emitter E1, the second emitter E2 and the third emitter E3.

Figure 7A:
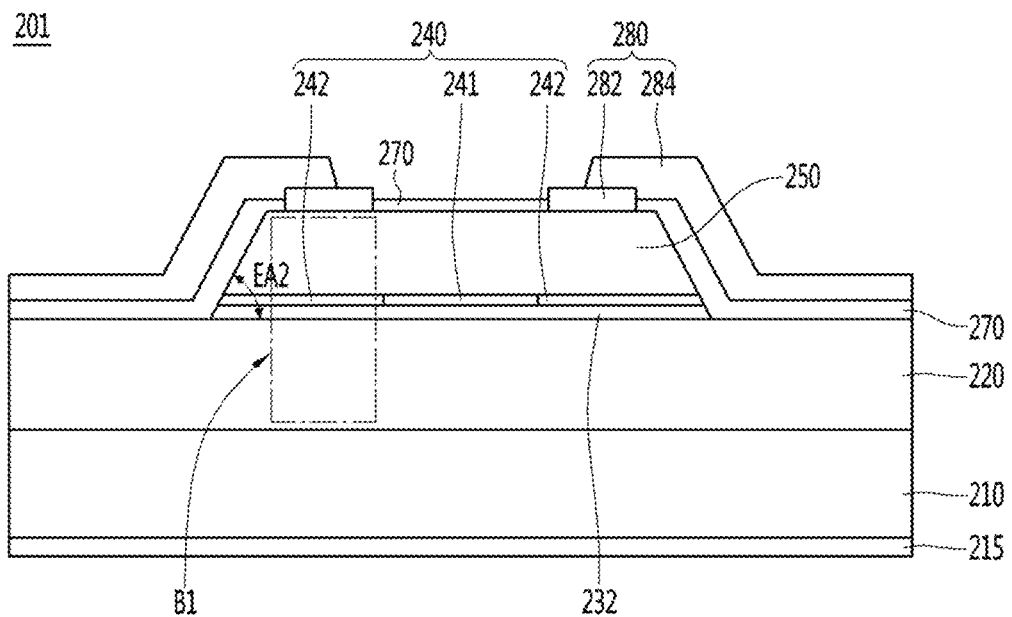
FIG. 7A is a cross-sectional view taken along line A1-A1' of the surface emitting laser device according to the embodiment shown in FIG. 6.

Next, FIG. 7A is a first cross-sectional view taken along line A1-A1' of the surface emitting laser device according to the embodiment shown in FIG. 6.

Referring to FIG. 7A, in the embodiment, the surface emitting laser device 201 includes any one or more of a first electrode 215, a substrate 210, a first reflective layer 220, an active layer 232, an aperture area 240, a second reflective layer 250, a second electrode 280, and a passivation layer 270.

The aperture area 240 may include an aperture 241 and an insulating area 242. The insulating area 242 may be referred to as an oxide layer, and the aperture region 240 may be referred to as an oxidation region, but is not limited thereto.

The second electrode 280 may include a contact electrode 282 and a pad electrode 284.

Figure 7B:
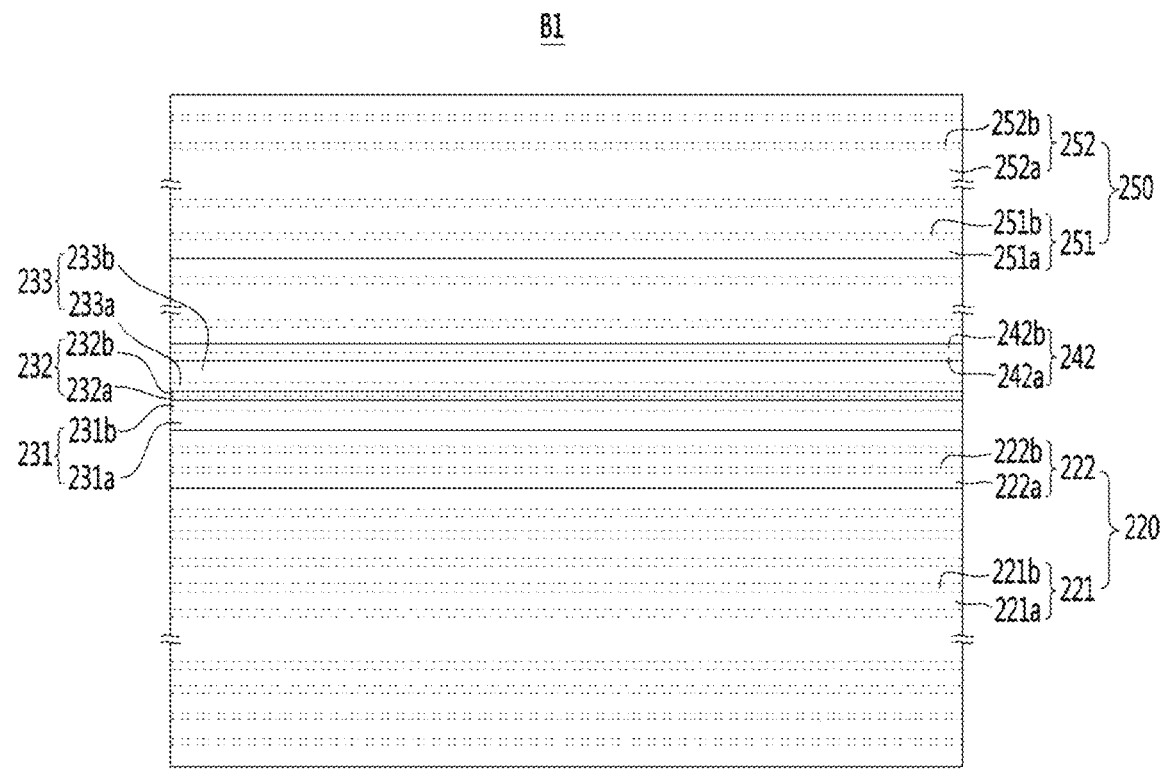
FIG. 7B is a cross-sectional view of a first portion B1 of the surface emitting laser device according to the embodiment shown in FIG. 7A.

Next, FIG. 7B is an enlarged cross-sectional view of the first portion B1 of the surface emitting laser device according to the embodiment shown in FIG. 7A.

Hereinafter, the technical features of the surface emitting laser device 201 according to the embodiment will be described with reference to FIGS. 7A and 7B, and technical effects will be described with reference to the drawings. In the drawings of the embodiment, the direction of the x-axis may be a direction parallel to a length direction of the substrate 210, and the y-axis may be a direction perpendicular to the x-axis.

<Substrate, First Electrode>

Referring to FIG. 7A, in an embodiment, the substrate 210 may be a conductive substrate or a non-conductive substrate. When a conductive substrate is used, a metal having excellent electrical conductivity can be used, and since it may sufficiently dissipate heat generated when the surface emitting laser device 201 is operated, a GaAs substrate with high thermal conductivity, a metal substrate, or a substrate, etc. can be used.

When a non-conductive substrate is used, an AlN substrate, a sapphire ($Al_2O_3$) substrate, or a ceramic-based substrate may be used.

In an embodiment, the first electrode 215 may be disposed under the substrate 210, and the first electrode 215 may be disposed as a single layer or multiple layers of a conductive material. For example, the first electrode 215 may be a metal, and at least one of aluminum (Al), titanium (Ti), chromium (Cr), nickel (Ni), copper (Cu), and gold (Au). And it is formed in a single-layer or multi-layer structure to improve electrical properties, thereby increasing light output.

<First Reflective Layer, Second Reflective Layer>

Referring to FIG. 7B, the first reflective layer 220 may be doped with a first conductivity type dopant. For example, the first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

For example, as shown in FIG. 7B, the first reflective layer 220 includes a first group first reflective layer 221 disposed on the substrate 210 and a second group first reflective layers 222 disposed on the first group first reflective layer 221.

The first group first reflective layer 221 and the second group first reflective layer 222 may include a plurality of layers made of a semiconductor material having a composition formula of $Al_xGa_{(1-x)}As$ ($0<x<1$). When Al in each layer increases, the refractive index of each layer decreases, and when Ga increases, the refractive index of each layer may increase.

In addition, a thickness of each layer may be $\lambda/4n$. $\lambda$ may be a wavelength of light generated in the active region 230, and n may be a refractive index of each layer with respect to the above-described light of the wavelength. Here, $\lambda$ may be 650 to 980 nanometers (nm), and n may be the refractive index of each layer. The first reflective layer 220 having such a structure may have a reflectance of 99.999% for light in a wavelength region of about 940 nanometers.

The thickness of the layer in each of the first reflective layers 220 may be determined according to each refractive index and a wavelength $\lambda$ of light emitted from the active region 230.

In addition, as shown in FIG. 7B, the first group first reflective layer 221 and the second group first reflective layer 222 may be formed of a single layer or a plurality of layers, respectively.

For example, the first group first reflective layer 221 may include about 30 to 40 pairs of the first group first-first layer 221a and the first group first-second layer 221b. The first group first-first layer 221a may be formed to be thicker than the first group first-second layer 221b. For example, the first group first-first layer 221a may be formed to be about 40 to 60 nm, and the first group first-second layer 221b may be formed to be about 20 to 30 nm.

In addition, the second group first reflective layer 222 may also include about 5 to 15 pairs of the second group first-first layer 222a and the second group first-second layer 222b. The second group first-first layer 222a may be formed to be thicker than the second group first-second layer 222b. For example, the second group first-first layer 222a may be formed to be about 40 to 60 nm, and the second group first-second layer 222b may be formed to be about 20 to 30 nm.

In addition, as shown in FIG. 7B, the second reflective layer 250 may include a gallium-based compound, for example, AlGaAs, and the second reflective layer 250 may be doped with a second conductivity type dopant. The second conductivity-type dopant may be a p-type dopant such as Mg, Zn, Ca, Sr, Ba, or the like. Meanwhile, the first reflective layer 220 may be doped with a p-type dopant, or the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

Each layer of the second reflective layer 250 may include AlGaAs, and in detail, may be made of a semiconductor material having a composition formula of $Al_xGa_{(1-x)}As$ (0<x<1). Here, when Al increases, the refractive index of each layer decreases, and when Ga increases, the refractive index of each layer may increase. In addition, the thickness of each layer of the second reflective layer 250 is $\lambda/4n$, $\lambda$ may be a wavelength of light emitted from the active layer, and n may be a refractive index of each layer with respect to the light of the above-described wavelength.

The second reflective layer 250 having such a structure may have a reflectance of 99.9% for light in a wavelength region of about 940 nanometers.

The second reflective layer 250 may be formed by alternately stacking layers, and the number of pairs of layers in the first reflective layer 220 may be greater than the number of pairs of layers in the second reflective layer 250. In this case, as described above, the reflectance of the first reflective layer 220 is about 99.999%, which may be greater than the reflectance of 99.9% of the second reflective layer 250.

In an embodiment, the second reflective layer 250 may include a first group second reflective layer 251 disposed adjacent to the active region 230 and a second group second reflective layer 252 spaced apart from the active region 230 than the first group second reflective layer 251.

As shown in FIG. 7B, the first group second reflective layer 251 and the second group second reflective layer 252 may also be formed of a single layer or a plurality of layers, respectively.

For example, the first group second reflective layer 251 may include about 1 to 5 pairs of the first group second-first layer 251a and the first group second-second layer 251b. The first group second-first layer 251a may be formed to be thicker than the first group second-second layer 251b. For example, the first group second-first layer 251a may be formed to be about 40 to 60 nm, and the first group second-second layer 251b may be formed to be about 20 to 30 nm.

In addition, the second group second reflective layer 252 may also include about 5 to 15 pairs of the second group second-first layer 252a and the second group second-second layer 252b. The second group second-first layer 252a may be formed to be thicker than the second group second-second layer 252b. For example, the second group second-first layer 252a may be formed to be about 40 to 60 nm, and the second group second-second layer 252b may be formed to be about 20 to 30 nm.

<Active Layer>

With continued reference to FIG. 7B, the active layer 232 may be disposed between the first reflective layer 220 and the second reflective layer 250.

The active layer 232 may include any one of a single well structure, a multiple well structure, a single quantum well structure, a multi quantum well (MQW) structure, a quantum dot structure, or a quantum wire structure.

The active layer 232 may include a well layer 232a and a barrier layer 232b using a compound semiconductor material of a group III-V element. The well layer 232a may be formed of a material having an energy band gap smaller than the energy band gap of the barrier layer 232b. The active layer 232 may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

<Cavity>

In an embodiment, predetermined cavities 231 and 233 may be disposed between the first reflective layer 220 and the second reflective layer 250.

In an embodiment, the cavities may be disposed in contact with each of the active layers 232 and may include a first cavity 231 disposed between the active layer 232 and the first reflective layer 220 and a second cavity 233 disposed between the active layer 232 and the second reflective layers 250.

The first cavity 231 and the second cavity 233 may be formed of an $Al_yGa_{(1-y)}As$ (0<y<1) material, but are not limited thereto. For example, the first cavity 231 and the second cavity 233 may include a plurality of layers of $Al_yGa_{(1-y)}As$.

For example, the first cavity 231 may include a first-first cavity layer 231a and a first-second cavity layer 231b. The first-first cavity layer 231a may be spaced apart from the active layer 232 more than the first-second cavity layer 231b. The first-first cavity layer 231a may be formed to be thicker than the first-second cavity layer 231b, but is not limited thereto.

In addition, the second cavity 233 may include a second-first cavity layer 233a and a second-second cavity layer 233b. The second-second cavity layer 233b may be further spaced apart from the active layer 232 compared to the second-first cavity layer 233a. The second-second cavity layer 233b may be formed to be thicker than the second-first cavity layer 233a, but is not limited thereto. In this case, the second-second cavity layer 233b may be formed to be about 60 to 70 nm, and the first-first cavity layer 231a may be formed to be about 40 to 55 nm, but it is not limited thereto.

<Aperture Area>

Referring back to FIG. 7A, in the embodiment, the aperture region 240 may include an insulating region 242 and an aperture 241. The aperture 241 may be referred to as an opening, and the aperture region 240 may be referred to as an opening region.

The insulating region 242 may be formed of an insulating layer, for example, aluminum oxide, and may function as a current blocking region, and an aperture 241 that is a light emission region may be defined by the insulating region 242.

For example, when the aperture region 240 includes aluminum gallium arsenide (AlGaAs), the AlGaAs of the aperture region 240 reacts with $H_2O$ to change the edge to aluminum oxide ($Al_2O_3$). Accordingly, the insulating region 242 may be formed, and the central region that does not react with $H_2O$ may be an aperture 241 made of AlGaAs.

According to the embodiment, light emitted from the active region 230 through the aperture 241 may be emitted to the upper region, and the aperture 241 may have excellent light transmittance compared to the insulating region 242.

Referring to FIG. 7B, the insulating region 242 may include a plurality of layers. For example, the insulating region 242 may include a first insulating layer 242*a* and a second insulating layer 242*b*. The first insulating layer 242*a* may have a thickness equal to or different from that of the second insulating layer 242*b*.

<Second Electrode, Ohmic Contact Layer, Passivation Layer>

Referring back to FIG. 7A, the emitter may be defined by mesa etching from the second reflective layer 250 to the aperture region 240 and the active region 230 in the surface emitting laser device 201 according to the embodiment. Also, a part of the first reflective layer 220 may be mesa etched.

Thereafter, the second electrode 280 may be disposed on the second reflective layer 250, and the second electrode 280 may include a contact electrode 282 and a pad electrode 284.

The passivation layer 270 may be disposed in a region between the contact electrodes 282 where the second reflective layer 250 is exposed, and may vertically correspond to the aperture 241. The contact electrode 282 may improve ohmic contact characteristics between the second reflective layer 250 and the pad electrode 284.

The second electrode 280 may be made of a conductive material, for example, a metal. For example, the second electrode 280 includes at least one of aluminum (Al), titanium (Ti), chromium (Cr), nickel (Ni), copper (Cu), and gold (Au).

As shown in FIG. 7A, a passivation layer 270 may be disposed on side surfaces and top surfaces of the mesa-etched light emitting structure, and on the top surface of the first reflective layer 220. The passivation layer 270 is also disposed on a side surface of the surface emitting laser device 201 separated by device units, and protects and insulates the surface emitting laser device 201. The passivation layer 270 may be made of an insulating material, for example, a nitride or an oxide. For example, the passivation layer 270 may include at least one of polyimide, silica ($SiO_2$), or silicon nitride ($Si_3N_4$).

The passivation layer 270 may have a thickness smaller than that of the contact electrode 282 on the upper surface of the light emitting structure, through which the contact electrode 282 may be exposed over the passivation layer 270. The pad electrode 284 may be disposed in electrical contact with the exposed contact electrode 282, and the pad electrode 284 may extend and be disposed above the passivation layer 270 to receive current from the outside.

One of the technical problems of the embodiment is to provide a surface emitting laser device and a light emitting device including the same, having excellent reliability.

Figure 8A:
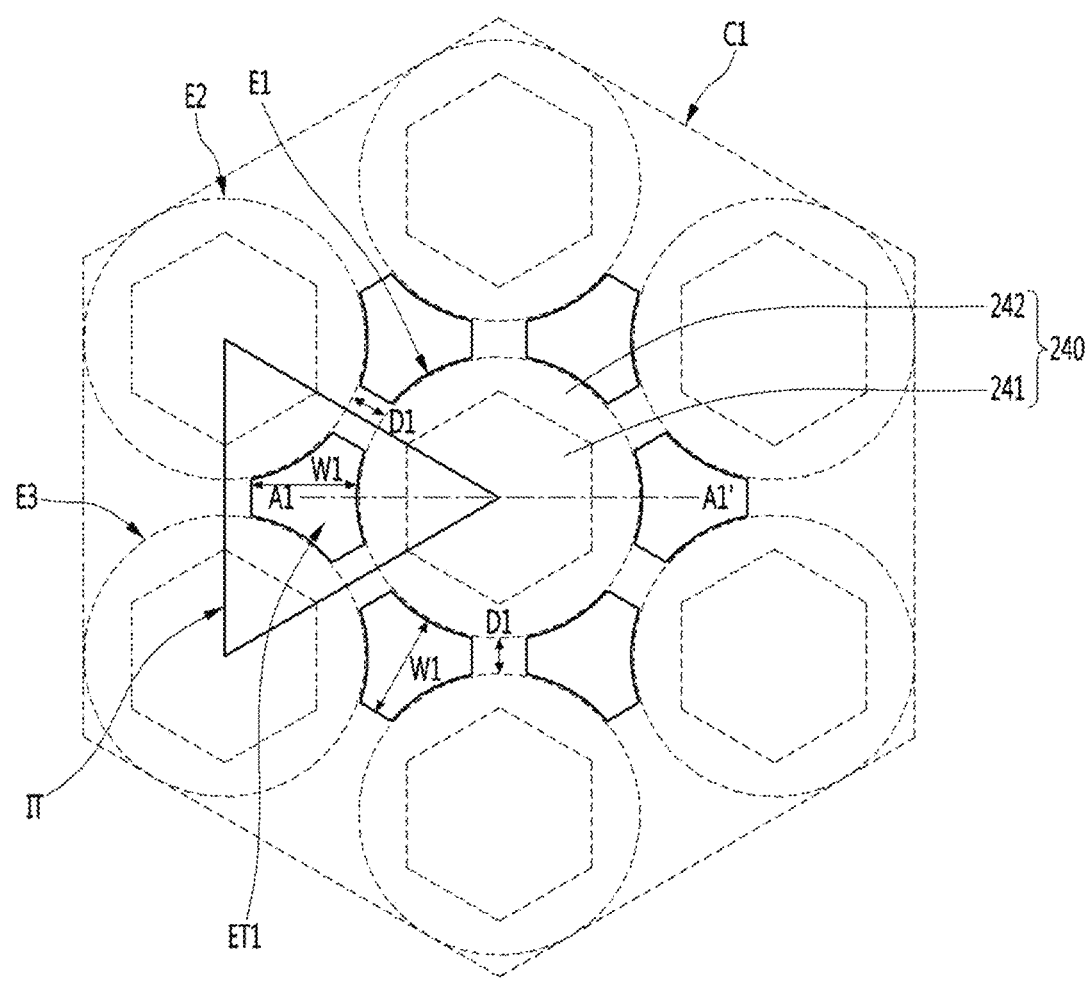
FIG. 8A is another enlarged view of the first area Cl of the surface emitting laser device according to the embodiment shown in FIG. 5.
Figure 8B:
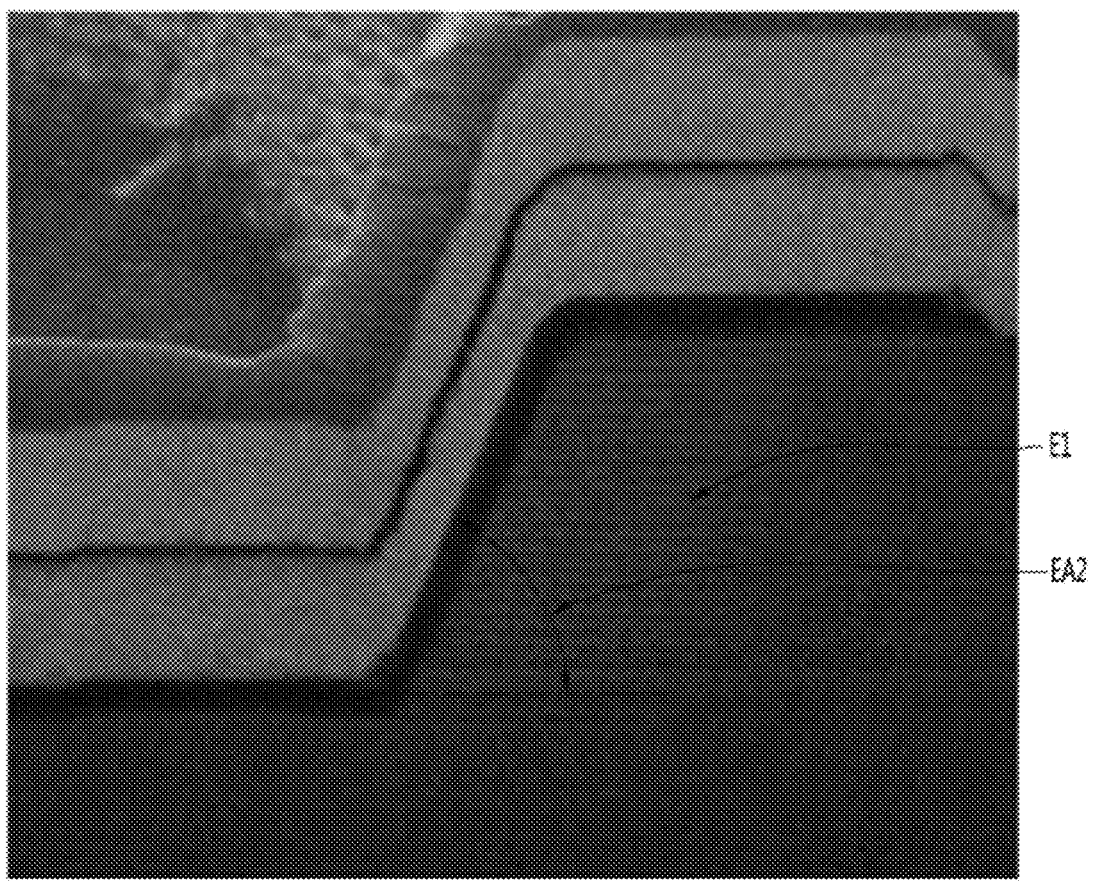
FIG. 8B is a cross-sectional photograph of a first emitter of the surface emitting laser device according to the embodiment shown in FIG. 8A along line A1-A1'.
Figure 8C:
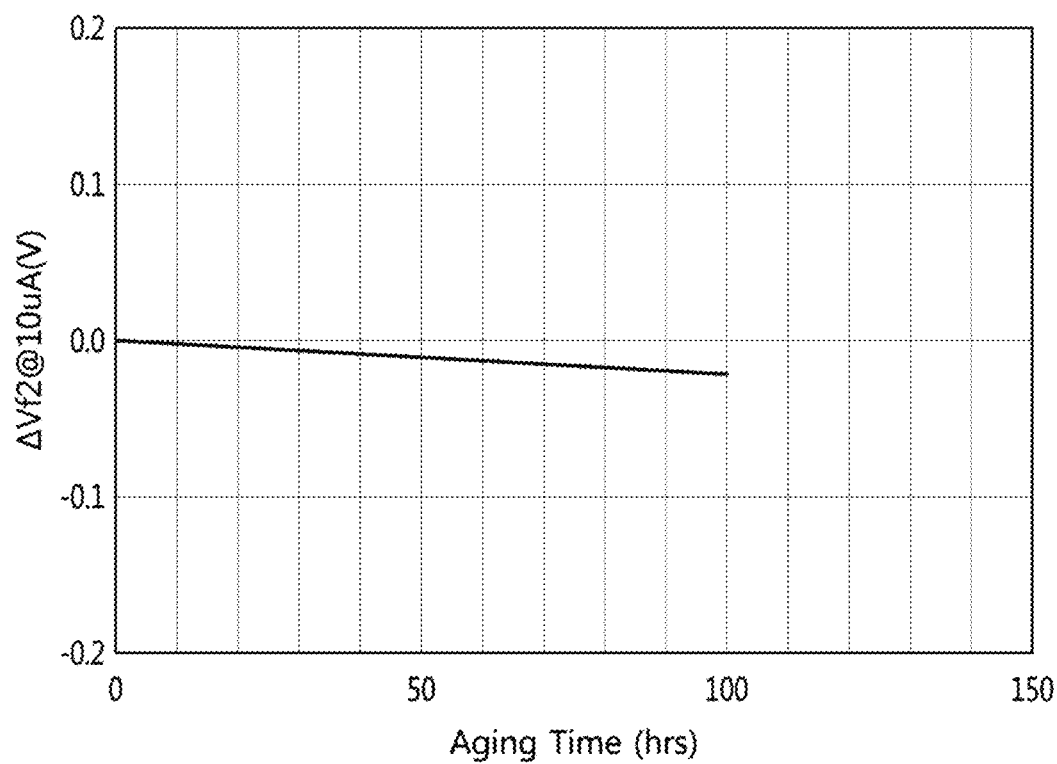
FIGS. 8C and 8D are reliability data of a surface emitting laser device according to a comparative example and an embodiment, respectively.

FIG. 8A is another enlarged view of the first area C1 of the surface emitting laser device according to the embodiment shown in FIG. 5, and FIG. 8B is a cross-sectional picture along line A1-A1' of the first emitter of the surface emitting laser device according to the embodiment shown in FIG. 8A. And FIG. 8C is an IR micrograph of the aperture area of the surface emitting laser device according to the embodiment shown in FIG. 8A. And FIG. 8D a near field image data of the aperture area of the light emitting laser device.

Referring to FIG. 8A, the surface emitting laser device 201 of the embodiment includes a first emitter E1 including a first aperture 241, a first insulating region 242, a second emitter E2 including a second aperture 241*b*, a second insulating region 242*b* disposed adjacent to the first emitter E1, a third emitter E3 including a third aperture 241*c*, a third insulating region 242*c* disposed adjacent to the second emitter E2 and a first trench region ET1 disposed between the first emitter E1 to the third emitter E3.

At this time, the first trench region ET1 may be disposed inside a virtual triangle IT connecting a center of the first aperture 241 of the first emitter E1, a center of the second aperture 241*b* of the second emitter E2, and a center of the third aperture 241*c* of the third emitter E3.

In addition, in the embodiment, the first trench region ET1 may not meet a first virtual line connecting the center of the first aperture 241 of the first emitter E1 and the center of the second aperture 241*b* of the second emitter E2.

In addition, the first trench region ET1 may not meet a second virtual line connecting the center of the second aperture 241*b* of the second emitter E2 and the center of the third aperture 241*c* of the third emitter E3.

In addition, the first trench region ET1 may not meet a third virtual line connecting the center of the first aperture 241 of the first emitter E1 and the center of the third aperture 241*c* of the third emitter E3.

As described above, in order to increase the oscillation area when applying the trench in the related art, the spacing between the emitters must be narrowed. However, for this, the trench etching angle EA1 becomes almost a right angle. However, as the etching angle EA1 becomes steep, the first void V1 is generated in the passivation process using a dielectric material formed later, thereby causing cracks.

In addition, as an electrode material is disposed on the passivation at the trench location, the first void V1 generated in the passivation is transferred to the electrode material to generate a second void V2 such that there is a problem of reduce reliability owing to arising moisture penetration or low current generation.

As shown in FIG. 8A, the first trench area ET1 of the embodiment can be placed in a virtual triangle connecting the center of the first aperture 241, the center of the second aperture 241*b*, and the center of the third aperture 241*c* such that a trench area can be widened.

Referring to FIGS. 7A and 8B, in an embodiment, an inclination angle EA2 of the sidewall of the first emitter E1 formed by the trench region can be formed smoothly by expanding the region in which the trench region can be secured. Therefore, the reliability can be remarkably improved by preventing void generation in the passivation layer process formed later.

For example, in the embodiment, the first trench area ET1 can be disposed inside a virtual triangle IT connecting the center of the first aperture 241, the center of the second aperture 241*b*, and the center of the third aperture 241*c*. Accordingly, by expanding the area in which the trench area can be secured, the inclination angle EA2 of the sidewall of the first emitter E1 formed by the trench area can be smoothly formed to be 75° or less. So, reliability can be remarkably improved by preventing the generation of voids in the passivation layer process formed after that.

Also, referring to FIG. 8A, in the embodiment, the first emitter E1 and the second emitter E2 are separated by a first separation distance D1. And a first width W1 of the first trench region ET1 may be larger than the first separation distance D1, accordingly, the area capable of securing the trench region may be widened compared to the related art, thereby improving reliability.

Figure 8D:
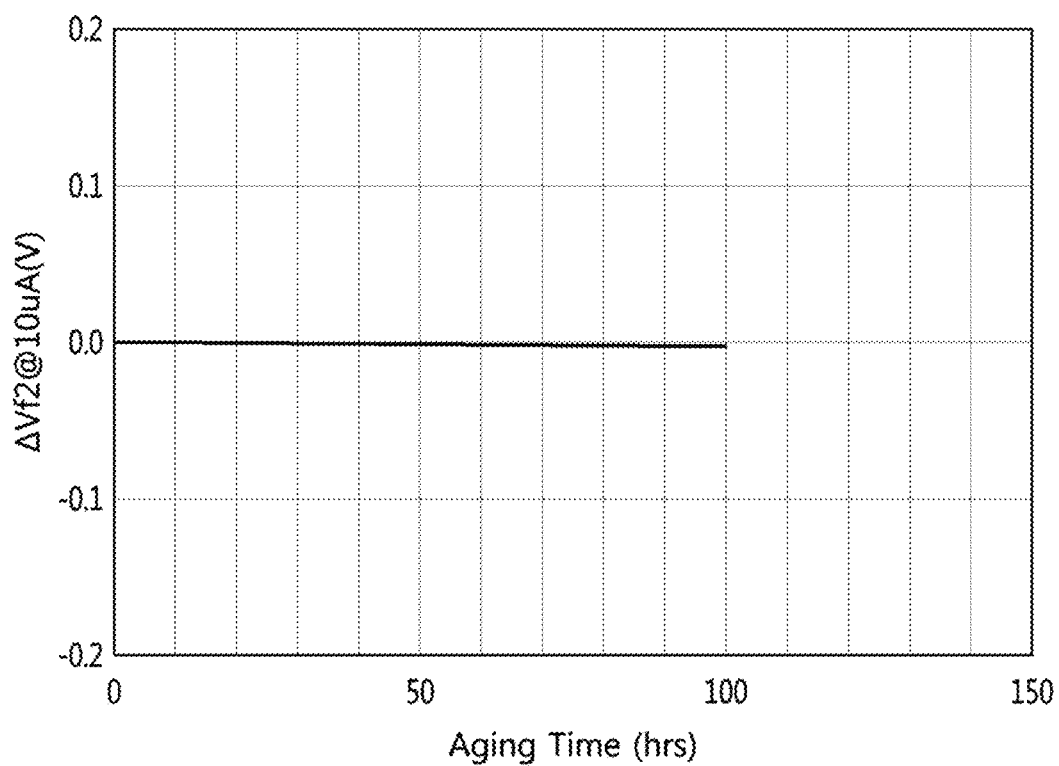

For example, FIGS. 8C and 8D are reliability data of a surface emitting laser device according to a comparative example and an example of embodiment, respectively.

Referring to FIG. 8C, when the inclination angle of the trench is as high as about 85°, there is a problem in that electrical reliability changes as the aging time elapses.

On the other hand, referring to FIG. 8D, when the inclination angle of the trench is less than about 75°, there is a technical effect of maintaining electrical reliability as the aging time elapses.

Figure 9A:
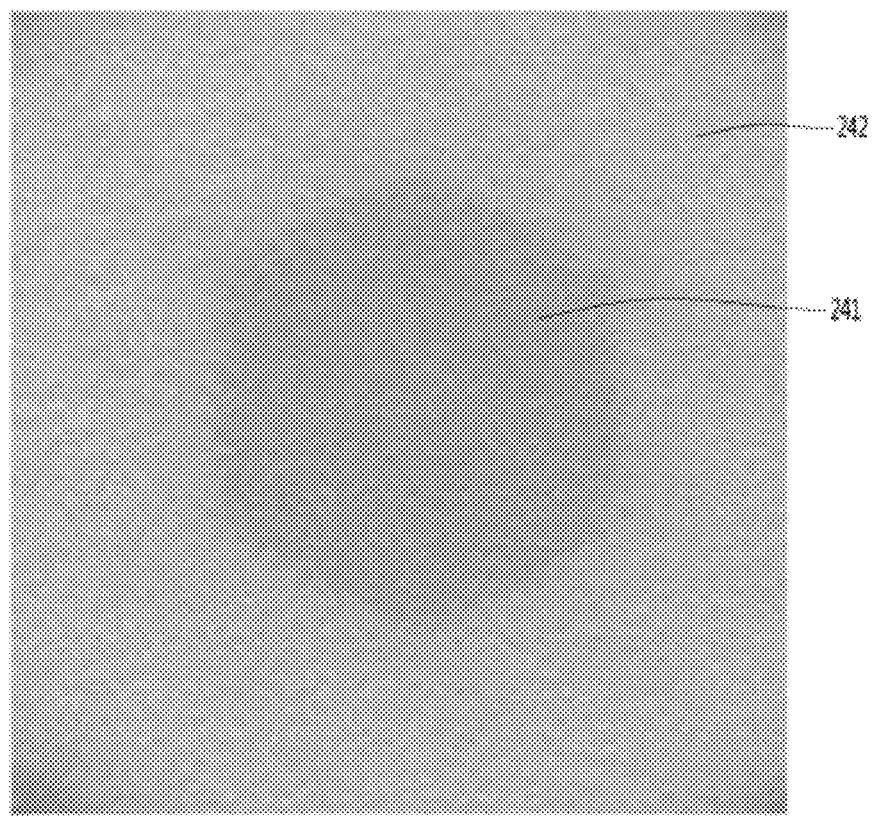
FIG. 9A is an IR micrograph of an aperture area of the surface emitting laser device according to the embodiment shown in FIG. 8A.
Figure 9B:
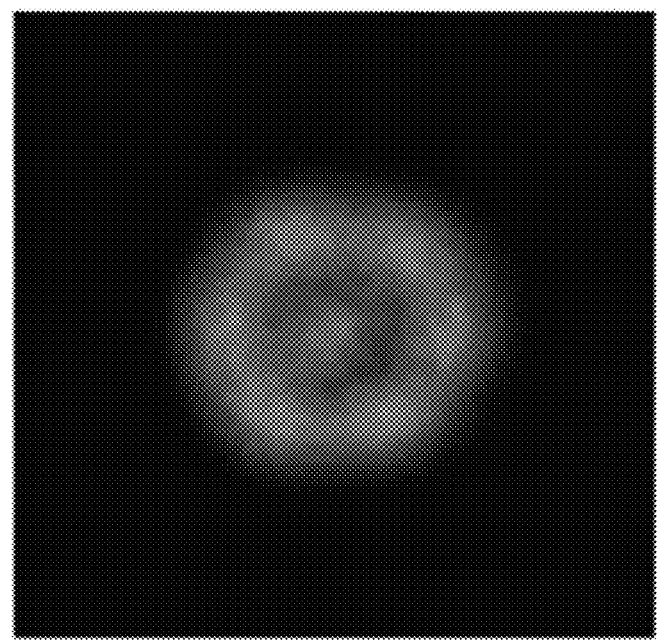
FIG. 9B is a near field image data of an aperture area of the surface emitting laser device according to the embodiment shown in FIG. 8A.
Figure 9C:
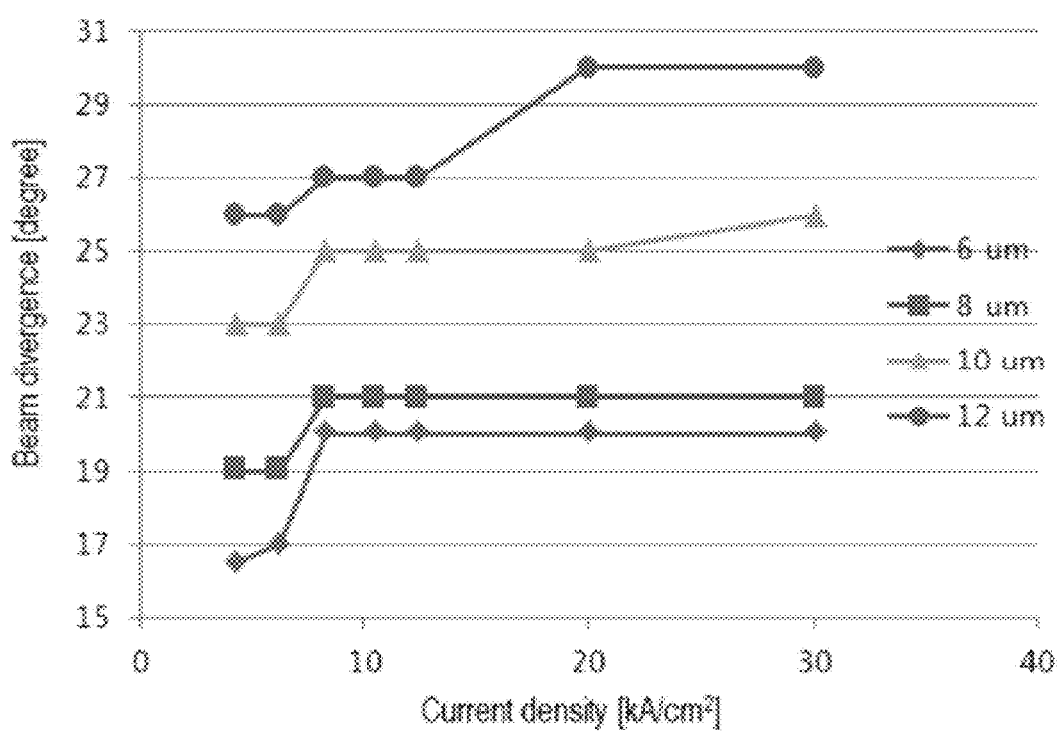
FIG. 9C is data of change in divergence angle according to current density for each aperture size in an embodiment.

Next, FIG. 9A is an IR micrograph of the aperture area of the surface emitting laser device according to the embodiment shown in FIG. 8A, and FIG. 9B is near field image data of the aperture area of the surface emitting laser device according to the embodiment shown in FIG. 8A. And FIG. 9C is data of change in divergence angle according to current density for each aperture size in the embodiment.

In addition, one of the other technical problems of the embodiment is to provide a surface emitting laser device and a light emitting device including the same, capable of preventing the splitting problem of a beam pattern an increase in the divergence angle of beams according to a higher mode shift despite high current application or an increase in aperture size.

Referring to FIG. 9A, in an embodiment, the aperture region 240 includes an insulating region 242 and an aperture 241, and the aperture 241 may include a polygonal horizontal cross section.

For example, in the embodiment, the polygonal cross section of the aperture 241 may be in any one of a triangular to a hexagonal shape. For example, the outer angle of the aperture 241 may be any one of a triangular shape, a quadrangular shape, a pentagonal shape, a hexagonal shape, or a hexagonal shape. Although the outer shape of the aperture 241 in FIG. 9A is illustrated as a hexagonal shape, it is not limited thereto.

In addition, in the embodiment, the outer periphery of the insulating region 242 among the aperture regions 240 may be circular, but is not limited thereto. For example, the outside of the insulating region 242 may also be a polygon.

FIG. 9B is near field image data of the aperture region of the surface emitting laser device according to the embodiment, it can be seen that the oscillation mode of the aperture is stable in a wavelength region of about 810 nm to 980 nm.

Specifically, FIG. 9C is also the data of the divergence angle change according to the current for each aperture size in the embodiment.

According to the embodiment, there is a special technical effect of stably controlling the oscillation mode and the divergence angle according to the current range and the aperture size in the wavelength region of about 810 nm to 980 nm.

In the embodiment, the divergence angle of the surface emitting laser device was measured using an LEDGON-100 goniophotometer (Instrument Systems Optische Messtechnik GmbH, Germany), but is not limited thereto.

For example, the referring to FIG. 9C, the size of the aperture in 6.0 μm embodiment, in the case where the current density is controlled as 8.3 kA/cm$^3$ to 30.0 kA/cm$^3$, oscillation mode is the secondary mode, and the divergence angle is stably controlled as about 20° in the current region 7 mA.

In addition, when the size of one aperture in 8.0 μm embodiment, in the case where the current density is controlled as 8.3 kA/cm$^3$ to 30.0 kA/cm$^3$, there is a special technical effect in that the mode is the secondary mode and the divergence angle is stably controlled at about 21° while the current may be changed to a 7 mA, 9 mA, 12 mA, 14 mA.

In addition, when the size of one aperture in 10.0 μm embodiment, in the case where the current density is controlled as 8.3 kA/cm$^3$ to 30.0 kA/cm$^3$, there is a special technical effect that the mode is the secondary mode and the divergence angle is stably controlled at about 25° while the current may be changed to a 7 mA, 9 mA, 12 mA, 14 mA oscillation.

In addition, when the size of one aperture in 12.0 μm embodiment, in the case where the current density is controlled as 8.3 kA/cm$^3$ to 30.0 kA/cm$^3$, there is a special technical effect of stably controlling the divergence angle to about 27° while the current is 9 mA, 12 mA, 14 mA.

Accordingly, in the embodiment, despite a high current is applied or an increase in the aperture size, it is possible to provide a surface emitting laser device and a light emitting device including the same, capable of preventing a problem of the divergence angle of beams being increased or the beam pattern being split according to a higher mode shift.

In the surface emitting laser device according to the embodiment, the shape of the trench region is controlled in a circular mesa state to form an aperture having a polygonal outer shape, so that there is a technical effect of preventing a problem in which the divergence angle of beams of the emission beam is increased or the beam pattern is split according to the mode shift owing to a higher-order mode shifts despite a high current is applied or an increase in the aperture size.

Figure 10A:
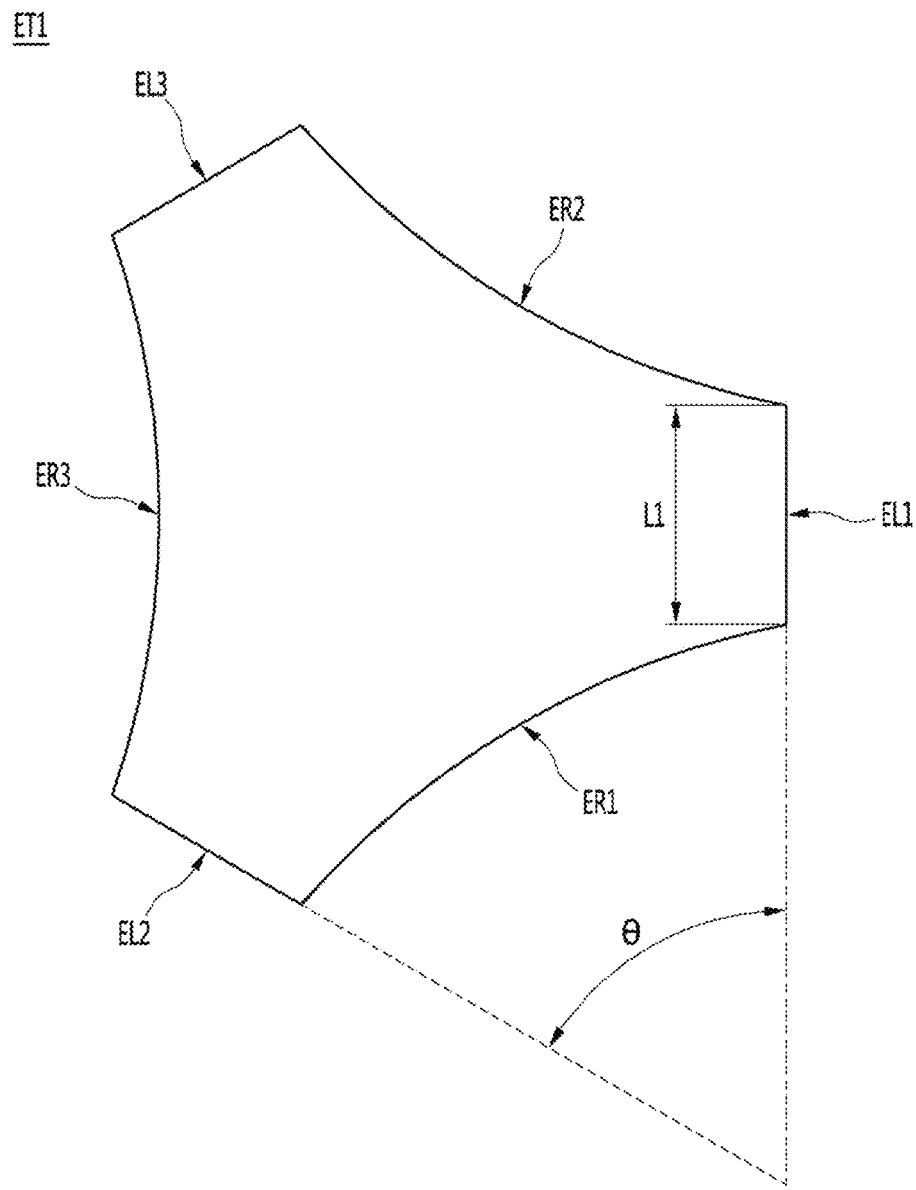
FIG. 10A is an enlarged view of a shape of a trench ET1 of a surface emitting laser device according to an embodiment.
Figure 10B:
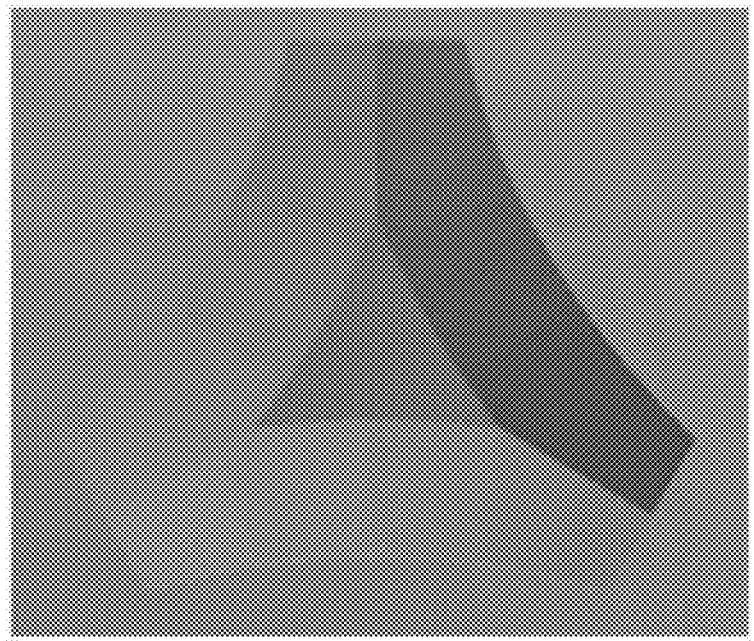
FIG. 10B is a three-dimensional etching shape of a trench region in a comparative example.
Figure 10C:
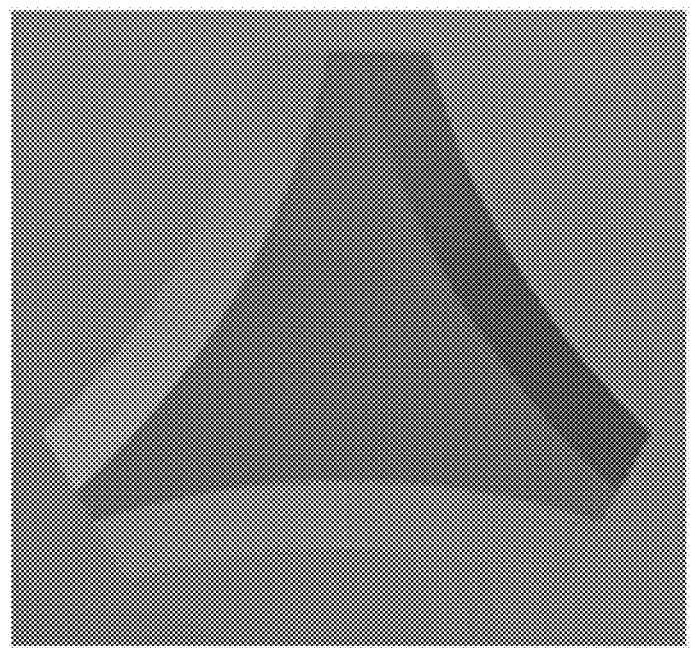
FIG. 10C is a three-dimensional etching shape of the trench ET1 in the embodiment.

Next, FIG. 10A is an enlarged view of a trench ET1 of a surface emitting laser device according to an embodiment, FIG. 10B is a three-dimensional etching shape of a trench region in a comparative example, and FIG. 10C is a three-dimensional etching shape of a trench ET1 in the embodiment.

Referring to FIG. 10A, in an embodiment, a first trench region ET1 includes a first round region ER1 and a first straight area EL1 and a second straight line EL2 disposed on both sides of the first round region ER1.

In addition, in the embodiment, the first trench region ET1 may include a second round region ER2 extending from the first straight region EL1 and a third round region ER3 extending from the second straight region EL2 and a third straight region EL3 disposed between the second round region ER2 and the third round region ER3.

In an embodiment, the first round region ER1 may have a convex shape downward in the center direction of the first trench region ET1, and the second round region ER2 and the third round region ER3 are also convex downward in the center direction of the first trench region, thereby forming an aperture having a polygonal outer shape. Therefore, there is a technical effect of preventing an increase in divergence angle of beams or splitting of a beam pattern according to a higher mode shift, even when a high current is applied or despite an increase in the aperture size.

In addition, in the embodiment, an aperture having a polygonal outer shape is formed in a sector having the first round region ER1 of the first trench region ET1 as an arc and the central angle Θ is controlled to be 25 to 45°. By doing so, it is possible to prevent the problem of increasing the divergence angle of beams or splitting the beam pattern according to higher mode shift even when high current is applied or an increase in aperture size.

In addition, in an embodiment, the first distance L1 of the first straight region EL1 of the first trench region ET1 is a first distance between the first emitter E1 and the second emitter E2. The inclination angle EA2 of the sidewall of the first emitter E1 formed by the trench region E1, which is formed by the trench region, is smoothly controlled by being controlled larger than the separation distance D1 to increase the region that can be secured by the first trench region ET1. Reliability can be remarkably improved by preventing the generation of voids in the passivation layer process formed afterward.

For example, in the embodiment, the first distance L1 of the first linear area EL1 of the first trench area ET1 is about 2 μm or more, and can be controlled larger than the first separation distance D1 between the first emitter E1 and the second emitter E2. Accordingly, the inclination angle EA2 of the sidewall of the first emitter E1 formed by the trench region E1 formed by the trench region E1 may be smoothly formed by widening the region secured by the first trench region ET1. Through this, it is possible to significantly improve reliability by preventing the generation of voids in the passivation layer process formed later.

FIG. 10B is a three-dimensional etching shape of the trench region in the second comparative example, and FIG. 10C is a three-dimensional etching shape of the trench ET1 in the embodiment.

Referring to FIG. 10B, it can be seen that when the straight region is small, the etching inclination angle is formed sharp in the three-dimensional shape of the trench region.

On the other hand, referring to FIG. 10C, it can be seen that when the straight region is large, the etching inclination angle is formed smooth in the three-dimensional shape of the trench region.

According to the embodiment, there is a technical effect in that the higher mode shift is delayed and the mode is maintained by controlling the available mode due to optical confinement by an aperture having a polygonal edge with excellent crystal quality.

For example, according to the embodiment, the available mode may be controlled by performing optical confinement at the edge of a polygon of the aperture 241 having excellent crystal quality. Accordingly, there is a special technical effect that the higher mode shift is delayed and the mode is maintained.

Figure 10D:
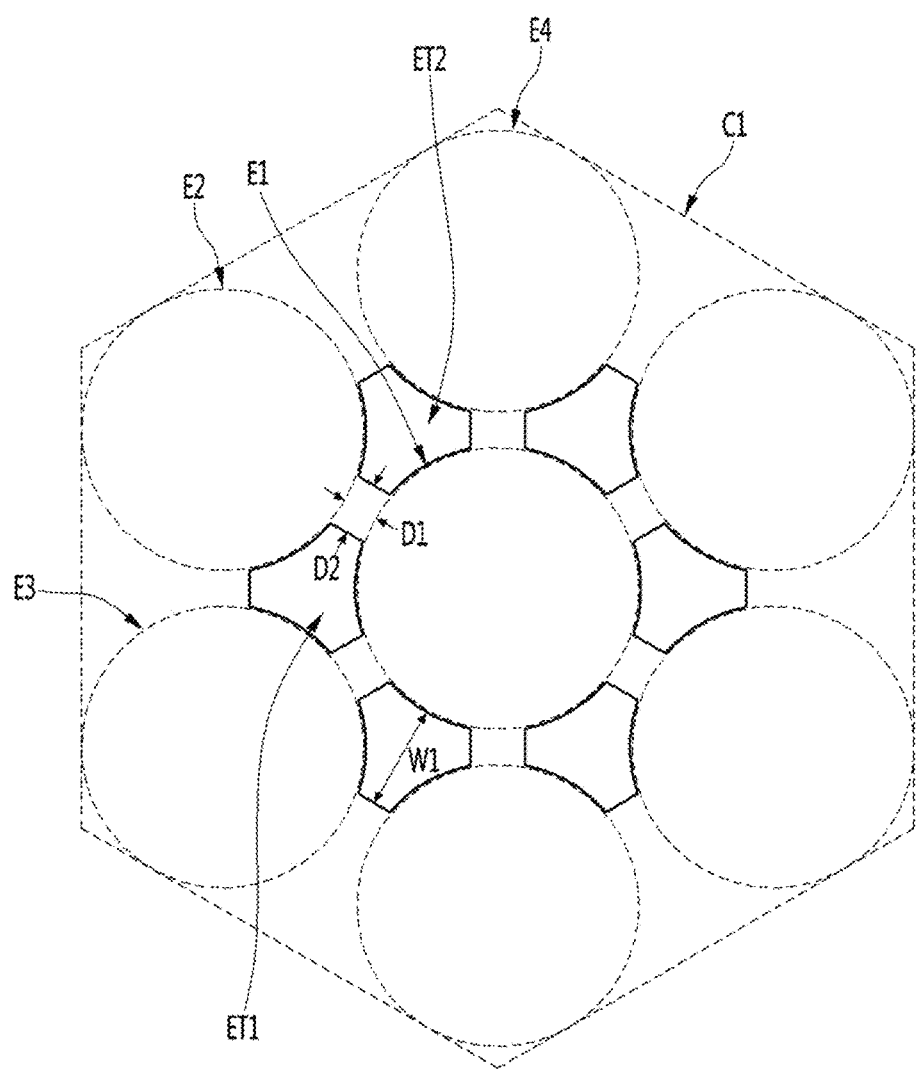
FIG. 10D is a plan view schematically illustrating a surface emitting laser device according to an embodiment.

FIG. 10D is a schematic plan view during manufacture of a surface emitting laser device according to an embodiment. For example, it may be a plan view in which a trench is formed after mesa etching is performed, and may be in a state before an oxidation process for each emitter is performed.

For example, the embodiment may include a first emitter E1 formed by a mesa etching process, a second emitter E2 disposed adjacent to the first emitter E1, a third emitter E3 disposed adjacent to the first side of the first emitter E1 and the second emitter E2, and a fourth emitter E4 adjacent to the second side of the first emitter E1 and the second emitter E2 arranged in such a way.

In addition, according to an embodiment, a first trench region ET1 disposed between the first emitter E1 to the third emitter E3 may be included. In addition, according to the embodiment, a second trench region ET2 disposed between the first emitter E1, the second emitter E2, and the fourth emitter E4 may be included.

The first trench region ET1 can be disposed inside a virtual triangle connecting the center of the first emitter E1, the center of the second emitter E2, and the center of the third emitter E3. Accordingly, by expanding the area that can be secured by the first trench area ET1, the inclination angles of the sidewalls of the first and second emitters E1 and E2 formed by the trench area can be smoothly formed. Therefore, it is possible to significantly improve reliability by preventing the occurrence of voids in the passivation layer process formed later.

In addition, the second trench region ET2 can be positioned inside a virtual triangle connecting the center of the first emitter E1, the center of the second emitter E2, and the center of the fourth emitter E4. Accordingly, by expanding the area that can be secured by the second trench area ET2, the inclination angles of the sidewalls of the first and second emitters E1 and E2 formed by the trench area can be smoothly formed. Therefore, it is possible to significantly improve reliability by preventing the occurrence of voids in the passivation layer process formed later.

In addition, in the embodiment, the second separation distance D2 between the first trench area ET1 and the second trench area ET2 can be controlled greater than the first separation distance D1 between the first emitter E1 and the second emitter E2. Accordingly, by forming an aperture having a polygonal outer shape, there is a technical effect of preventing an increase in divergence angle of beams or beam pattern division problem due to a higher mode shift even when a high current is applied or an increase in the aperture size.

For example, in an embodiment, the second separation distance D2 between the first trench region ET1 and the trench region ET2 is greater than the first separation distance D1 between the first emitter E1 and the second emitter E2 and can be controlled to be 5 times or less, so that an aperture having a polygonal outer shape can be formed.

For example, in an embodiment, the second separation distance D2 between the first trench area ET1 and the second trench area ET2 may be controlled to be about 2 μm to 10 μm. Accordingly, by forming an aperture having a polygonal outer shape, there is a technical effect of preventing an increase in divergence angle of beams or a beam pattern splitting problem according to a higher mode shift even when a high current is applied or the aperture size is increased.

Accordingly, according to the embodiment, the beam mode can be controlled even when the aperture size is increased or a high current is applied. Therefore, it is possible to provide a surface emitting laser device and a light emitting device including the same capable of solving the problem of splitting the beam pattern of the emission beam and increasing the divergence angle according to a higher mode shift.

(Embodiment of Flip Chip Structure)

Figure 11:
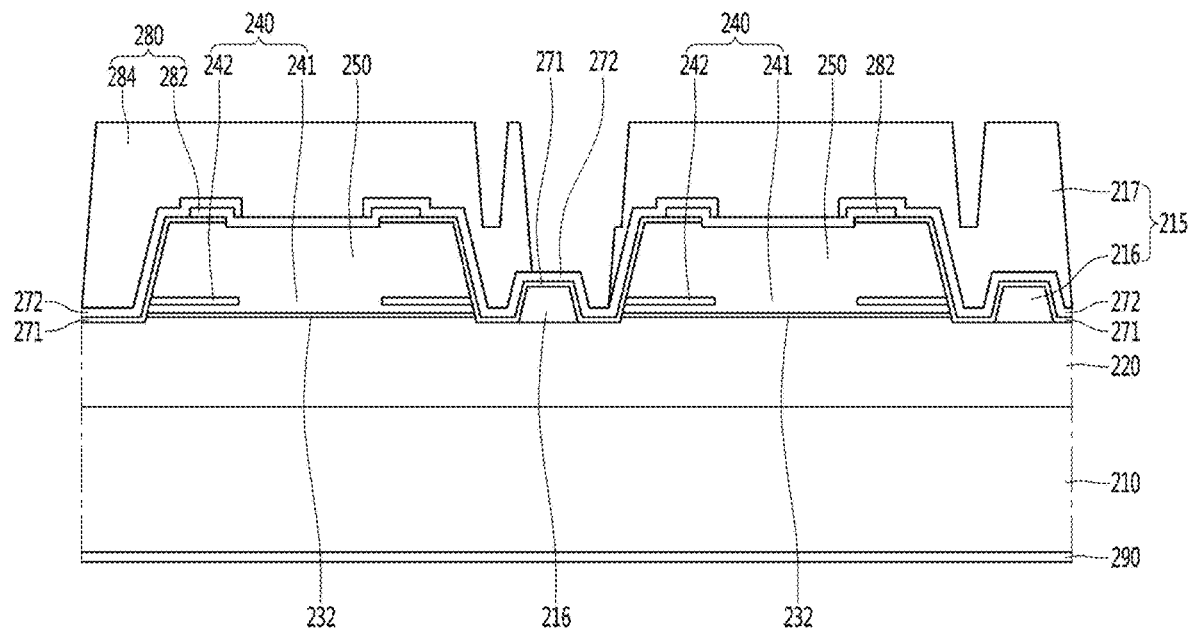
FIG. 11 is a cross-sectional view of a surface emitting laser device according to another embodiment.

Next, FIG. 11 is another cross-sectional view of a surface emitting laser device according to an embodiment.

In addition to the vertical type, the surface emitting laser device according to the embodiment may have a flip chip type in which the first electrode 215 and the metal electrode layer 280 have the same direction as shown in FIG. 11.

For example, as shown in FIG. 11, the surface emitting laser device according to another embodiment includes a first electrode 215, a substrate 210, a first reflective layer 220, an active layer 232, an aperture area 240, a second reflective layer 250, a metal electrode layer 280, a first passivation layer 271, a second passivation layer 272, and a non-reflective layer 290. In this case, the reflectivity of the second reflective layer 250 may be designed to be higher than that of the first reflective layer 220.

In this case, the first electrode 215 may include a first contact electrode 216 and a first pad electrode 217. The first contact electrode 216 may be electrically connected to the first reflective layer 220 exposed through a predetermined mesa process, and the first pad electrode 217 may be electrically connected to the first contact electrode 216.

The first electrode 215 may be made of a conductive material, for example, a metal. For example, the first electrode 215 includes at least one of aluminum (Al), titanium (Ti), chromium (Cr), nickel (Ni), copper (Cu), and gold (Au).

When the first reflective layer 220 is an n-type reflective layer, the first electrode 215 may be an electrode for the n-type reflective layer.

Next, the metal electrode layer 280 may include a second contact electrode 282 and a second pad electrode 284, and the second contact electrode 282 is electrically connected to the second reflective layer 250. The second pad electrode 284 may be electrically connected to the second contact electrode 282.

When the second reflective layer 250 is a p-type reflective layer, the metal electrode layer 280 may be an electrode for the p-type reflective layer.

The first insulating layer 271 and the second insulating layer 272 may be made of an insulating material, for example, nitride or oxide, for example, polyimide, silica ($SiO_2$) or it may include at least one of silicon nitride ($Si_3N_4$).

(Mobile Terminal)

The surface emitting laser device according to the embodiment may be applied to a mobile terminal or the like.

Figure 12:
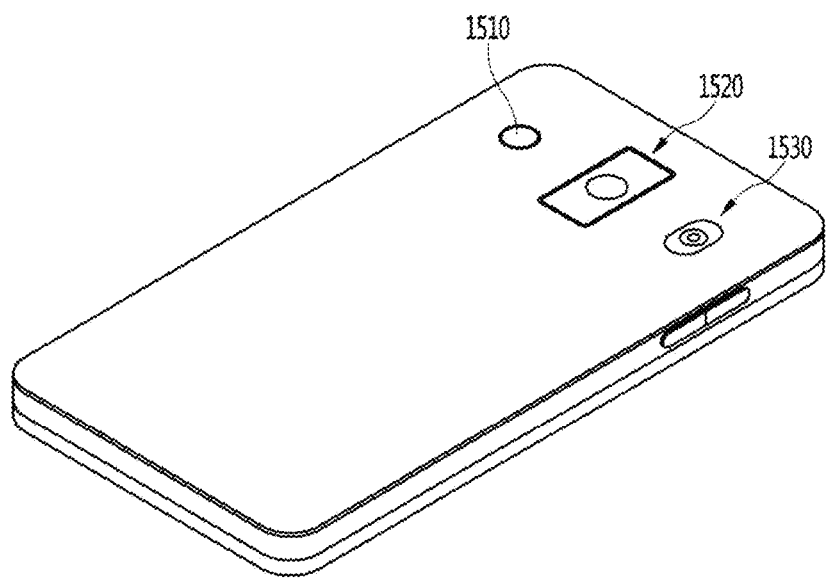
FIG. 12 is a perspective view of a mobile terminal to which a surface emitting laser device is applied according to an embodiment.

For example, FIG. 12 is a perspective view of a mobile terminal to which a surface emitting laser device is applied according to an embodiment.

As shown in FIG. 12, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as a light emitting unit.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The autofocus device 1510 may be mainly used in a condition in which an autofocus function using an image of the camera module 1520 is deteriorated, for example, in a proximity or dark environment of 10 m or less. The auto-focusing device 1510 may include a light emitting unit including a vertical cavity surface emission laser (VCSEL) semiconductor element, and a light receiving unit that converts light energy such as a photodiode into electrical energy.

Features, structures, effects, and the like described in the above embodiments are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, contents related to such combinations and modifications should be interpreted as being included in the scope of the embodiments.

Although the embodiments have been described above, these are only examples and are not intended to limit the embodiments, and those of ordinary skill in the field to which the embodiments belong to various types not illustrated above without departing from the essential characteristics of this embodiment. It will be seen that branch transformation and application are possible. For example, each component specifically shown in the embodiment can be modified and implemented. And differences related to these modifications and applications should be construed as being included in the scope of the embodiments set in the appended claims.

The invention claimed is:

1. A surface emitting laser device, comprising:
    a first emitter including a first polygonal shaped aperture and a first circular shaped insulating region;
    a second emitter including a second polygonal shaped aperture and a second circular shaped insulating region and disposed adjacent to the first emitter;
    a third emitter including a third polygonal shaped aperture and a third circular shaped insulating region and disposed adjacent to the first emitter and the second emitter, and the third emitter disposed on a first side of a first virtual line connecting a center of the first polygonal shaped aperture and a center of the second polygonal shaped aperture; and
    a first trench region disposed between the first emitter, the second emitter and the third emitter and forming sidewalls of the first emitter, the second emitter and the third emitter,
    wherein the first trench region is disposed inside a virtual triangle connecting the center and two corners of the first polygonal shaped aperture of the first emitter, the center and two corners of the second polygonal shaped aperture of the second emitter, and a center and two corners of the third polygonal shaped aperture of the third emitter,
    wherein the first trench region includes a first round region forming a first portion of a sidewall of the insulating region of the first emitter, a second round region forming a first portion of a sidewall of the insulating region of the second emitter, and a third round region forming a first portion of a sidewall of the insulating region of the third emitter,
    wherein the first, second and third round regions of the first trench respectively face sides of the first, second and third polygonal shaped apertures and are disposed inside the virtual triangle, and
    wherein a center angle of a sector having the first round region as an arc is 25 to 45°.

2. The surface emitting laser device according to claim 1, wherein an inclination angle of the sidewall of the first emitter formed by the first trench region is 75° or less.

3. The surface emitting laser device according to claim 1, wherein the first emitter and the second emitter are spaced apart by a first separation distance, and
    wherein a first width of the first trench region is greater than the first separation distance.

4. The surface emitting laser device according to claim 3, further comprising:
    a fourth emitter including a fourth polygonal shaped aperture and a fourth circular shaped insulating region and disposed adjacent to the first emitter and the second emitter, the fourth emitter disposed on a second side of the first virtual line connecting the center of the first polygonal shaped aperture and the center of the second polygonal shaped aperture, and the second side opposite to the first side of the first virtual line connecting the center of the first polygonal shaped aperture and the center of the second polygonal shaped aperture; and a second trench region disposed between the first emitter, the second emitter, and the fourth emitter, wherein the second trench region includes a fourth round region forming a second portion of the sidewall of the insulating region of the first emitter, a fifth round region forming a second portion of the sidewall of the insulating region of the second emitter, and a sixth round region forming a second portion of the sidewall of the insulating region of the fourth emitter, wherein a second separation distance between the first trench region and the second trench region is greater than the first separation distance.

5. The surface emitting laser device according to claim 1, wherein the first trench region further includes first, second and third straight regions connecting the first, second and third round regions.

6. A surface emitting laser device, comprising:
a first emitter including a first polygonal shaped aperture and a first circular shaped insulating region;
a second emitter including a second polygonal shaped aperture and a second circular shaped insulating region and disposed adjacent to the first emitter;
a third emitter including a third polygonal shaped aperture and a third circular shaped insulating region and disposed adjacent to the first emitter and the second emitter; and
a first trench region disposed between the first emitter, the second emitter and the third emitter and forming sidewalls of the first emitter, the second emitter and the third emitter,
wherein the first trench region is disposed inside a virtual triangle connecting a center and two corners of the first polygonal shaped aperture of the first emitter, a center and two corners of the second polygonal shaped aperture of the second emitter, and a center and two corners of the third polygonal shaped aperture of the third emitter,
wherein the first trench region includes a first round region forming a sidewall of the insulating region of the first emitter, a second round region forming a sidewall of the insulating region of the second emitter, and a third round region forming a sidewall of the insulating region of the third emitter,
wherein the first, second and third round regions of the first trench respectively face sides of the first, second and third polygonal shaped apertures and are disposed inside the virtual triangle,
wherein the first trench region further includes first, second and third straight regions connecting the first, second and third round regions,
wherein the first emitter and the second emitter are spaced apart by a first separation distance, and
wherein a length of the first straight region is larger than the first separation distance.

7. A surface emitting laser device, comprising:
a first emitter including a first polygonal shaped aperture and a first circular shaped insulating region;
a second emitter including a second polygonal shaped aperture and a second circular shaped insulating region and disposed adjacent to the first emitter;
a third emitter including a third polygonal shaped aperture and a third circular shaped insulating region and disposed adjacent to the first emitter and the second emitter; and
a first trench region disposed between the first emitter, the second emitter and the third emitter and forming sidewalls of the first emitter, the second emitter and the third emitter,
wherein the first trench region is disposed inside a virtual triangle connecting a center and two corners of the first polygonal shaped aperture of the first emitter, a center and two corners of the second polygonal shaped aperture of the second emitter, and a center and two corners of the third polygonal shaped aperture of the third emitter,
wherein the first trench region includes a first round region forming a sidewall of the insulating region of the first emitter, a second round region forming a sidewall of the insulating region of the second emitter, and a third round region forming a sidewall of the insulating region of the third emitter,
wherein the first, second and third round regions of the first trench respectively face sides of the first, second and third polygonal shaped apertures and are disposed inside the virtual triangle,
wherein the first trench region further includes first, second and third straight regions connecting the first, second and third round regions, and
wherein the first, second and third round regions are convex downward in a center direction of the first trench region.

8. A light emitting device comprising the surface emitting laser device of claim 1.

9. The surface emitting laser device according to claim 1, wherein the first trench region does not meet the first virtual line of the virtual triangle connecting the center of the first polygonal shaped aperture of the first emitter and the center of the second polygonal shaped aperture of the second emitter.

10. The surface emitting laser device according to claim 9, wherein the first trench region does not meet a second virtual line of the virtual triangle connecting the center of the second polygonal shaped aperture of the second emitter and the center of the third polygonal shaped aperture of the third emitter.

11. The surface emitting laser device according to claim 10, wherein the first trench region does not meet a third virtual line of the virtual triangle connecting the center of the first polygonal shaped aperture of the first emitter and the center of the third polygonal shaped aperture of the third emitter.

12. The surface emitting laser device according to claim 6, wherein the length of the first straight region of the first trench area is 2 µm or more.

13. The surface emitting laser device according to claim 4, wherein the second separation distance between the first trench region and the second trench region is greater than the first separation distance and less than 5 times of the first separation distance between the first emitter and the second emitter.

14. The surface emitting laser device according to claim 13, wherein the second separation distance between the first trench area and the second trench area is 2 µm to 10 µm.

* * * * *